(12) United States Patent
Wakui

(10) Patent No.: US 6,378,672 B1
(45) Date of Patent: Apr. 30, 2002

(54) ACTIVE VIBRATION ISOLATION DEVICE AND ITS CONTROL METHOD

(75) Inventor: Shinji Wakui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/413,471

(22) Filed: Oct. 6, 1999

(30) Foreign Application Priority Data

Oct. 13, 1998 (JP) .......................................... 10-304717
Oct. 30, 1998 (JP) .......................................... 10-324458

(51) Int. Cl.[7] ................................................. F16F 7/10
(52) U.S. Cl. ..................... 188/378; 267/140.14; 700/42
(58) Field of Search ................................. 188/378, 379, 188/380; 267/136, 140.11, 140.12, 140.14, 140.15; 700/28, 42

(56) References Cited

U.S. PATENT DOCUMENTS

| 4,083,433 A | * | 4/1978 | Geohegan, Jr. et al. . 188/1.11 E |
| 5,545,962 A | * | 8/1996 | Wakui ......................... 318/677 |
| 5,568,032 A | * | 10/1996 | Wakui ......................... 318/632 |
| 5,660,255 A | | 8/1997 | Schubert et al. ............. 188/378 |
| 5,823,307 A | | 10/1998 | Schubert et al. ............. 188/378 |
| 5,899,443 A | * | 5/1999 | Su ......................... 267/140.14 |

FOREIGN PATENT DOCUMENTS

JP          8-54039          2/1996

* cited by examiner

*Primary Examiner*—Pam Rodriguez
(74) *Attorney, Agent, or Firm*—Fitzpatrick, Cella, Harper & Scinto

(57) ABSTRACT

A hybrid active vibration isolation device has an intermediate plate inserted between a vibration damping subject and a setting surface on which the vibration damping subject is set, and laminated rubber and electromagnetic motors are interposed between the vibration damping subject and intermediate plate. A piezoelectric element is interposed between the intermediate plate and setting surface. In order to detect vibrations of the vibration damping subject, intermediate plate, and setting surface, velocity sensors are provided to them. The active vibration isolation device has a feedback mechanism for controlling the electromagnetic motors on the basis of signals from the velocity sensors provided to the vibration damping subject and setting surface, and controlling the piezoelectric element on the basis of a signal from the velocity sensor set on the intermediate plate.

5 Claims, 15 Drawing Sheets

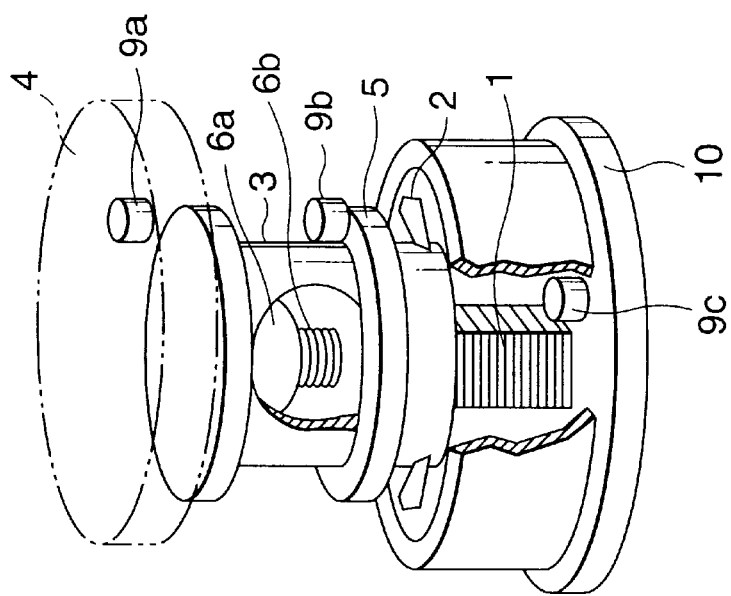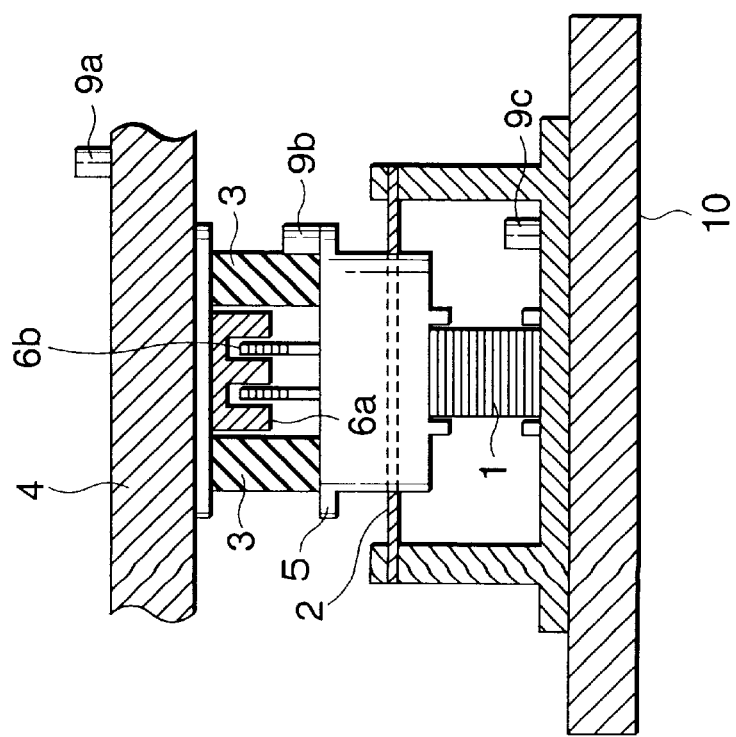

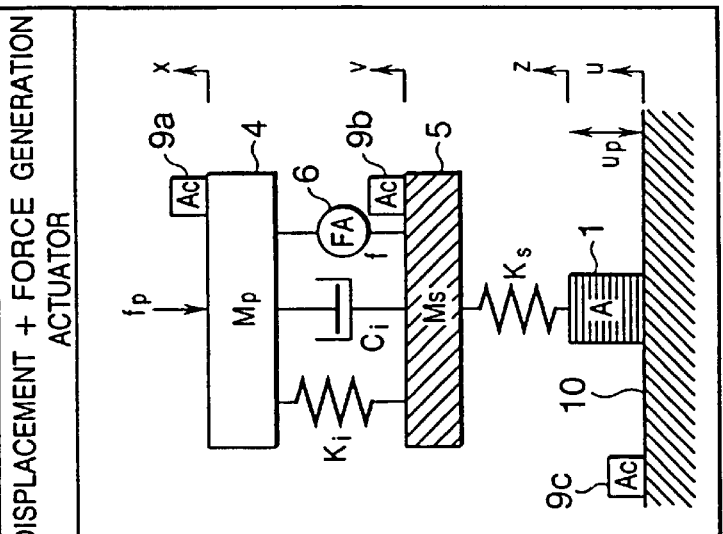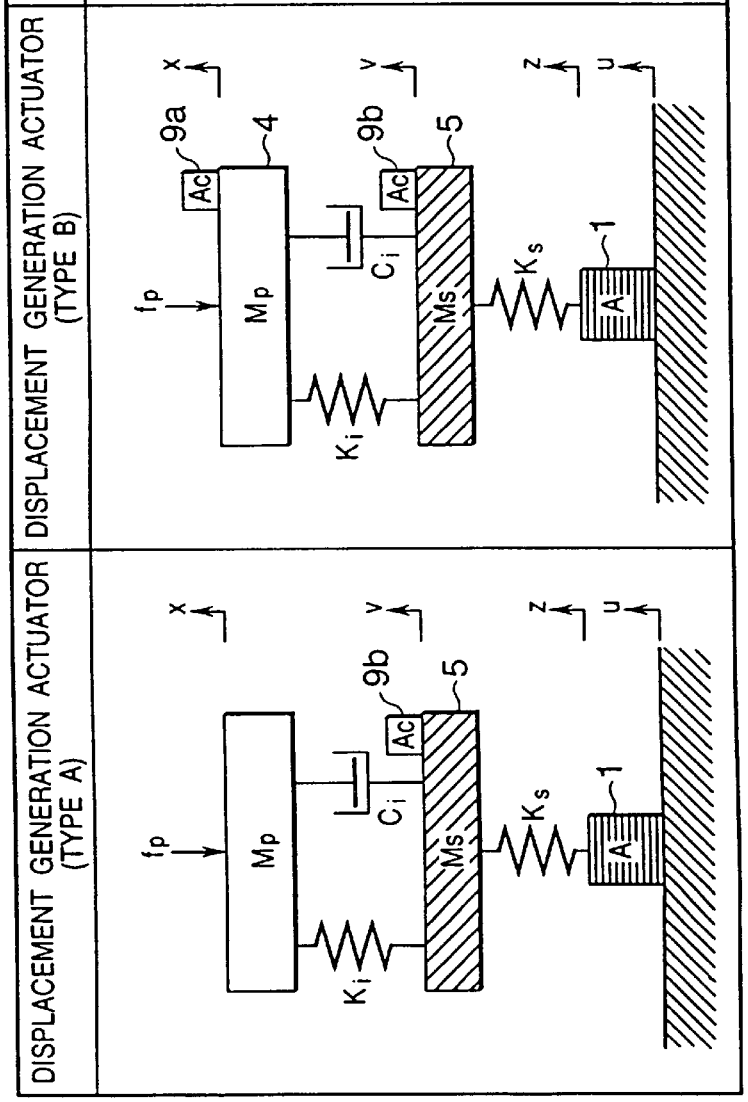

ACTIVE VIBRATION ISOLATION DEVICE AND ITS CONTROL METHOD

BACKGROUND OF THE INVENTION

The present invention relates to an active anti-vibration device used in a semiconductor exposure apparatus or liquid crystal substrate manufacturing apparatus for transferring and printing a circuit pattern on a reticle onto a semiconductor wafer, an electron microscope, or the like and, more particularly, to an anti-vibration device using a displacement generation element represented by a piezoelectric element or like, i.e., a displacement generation actuator active vibration isolation device comprising a versatile feedback process encompassing the prior art.

Also, the present invention relates to a hybrid active vibration isolation apparatus using an anti-vibration unit which integrates a displacement generation actuator (e.g., a piezoelectric element) and a force actuator (e.g., an electromagnetic motor).

In an electron microscope using an electron beam or a semiconductor manufacturing apparatus represented by a stepper, scanner, or the like, an X-Y stage is placed on an anti-vibration unit. The anti-vibration unit has a function of damping vibration by vibration absorbing means such as an air spring, coil spring, anti-vibration rubber, and the like. However, a passive anti-vibration unit having such vibration absorbing means can damp vibration that propagates from a floor to some extent, but cannot effectively damp vibration produced by the X-Y stage itself. That is, the counter force produced by high-speed movement of the X-Y stage itself vibrates the anti-vibration unit, and this vibration considerably impairs alignment settling performance of the X-Y stage.

Furthermore, the passive anti-vibration unit suffers a tradeoff between isolation of vibration (vibration isolation) that propagates from the floor, and suppression of vibration (vibration damping) produced upon generation of high-speed movement of the X-Y stage itself. To solve such problems, an active anti-vibration unit has been used more often in recent years. The active anti-vibration unit can eliminate the tradeoff between vibration isolation and vibration damping within the range of an adjustable mechanism, and can get performance that cannot be achieved by a passive anti-vibration unit by positively applying feedforward control.

However, in order to further suppress propagation of vibration to apparatuses that cannot tolerate vibration represented by a semiconductor manufacturing apparatus, vibration isolation is required for a still lower frequency range. For this purpose, attempts have been made to use an active vibration isolation device using a piezoelectric element, which can accurately control infinitesimal displacement, in vibration isolation of the entire semiconductor manufacturing apparatus. However, an anti-vibration device using an air spring or electromagnetic motor has been developed remarkably and has reached a practical level, but an active vibration isolation device using a piezoelectric element as an actuator stays at the level of laboratory study. The arrangement of its controller has not been examined extensively, and the performance of the piezoelectric element cannot be fully utilized.

The active vibration isolation device using a piezoelectric element that represents a displacement generation actuator includes three different types. The first type (type A) drives a piezoelectric element 1 on the basis of a signal output from a vibration detection means 9b on an intermediate plate 5, as shown in FIG. 7A. The second type (type B) drives a piezoelectric element 1 on the basis of outputs from vibration detection means 9b and 9a provided on an intermediate plate 5 and an object from which vibration is to be removed (to be referred as vibration damping subject) 4, as shown in FIG. 7B. The third type (type C) drives a force actuator 6 provided between an intermediate plate 5 and vibration damping subject 4 together with a piezoelectric element 1 on the basis of outputs from vibration detection means 9a, 9b, and 9c mounted on the vibration damping subject 4, the intermediate plate 5, and a floor 10, as shown in FIG. 7C. Higher performance characteristics are assured in the order of FIGS. 7A, 7B, and 7C.

Skipping an analysis for the arrangement shown in FIG. 7A, the feedback arrangement in FIG. 7B will be explained first. FIG. 8 shows a structure of an anti-vibration unit in which a piezoelectric element is built in as an actuator. Referring to FIG. 8, reference numeral 1 denotes a piezoelectric element; 2, a leaf spring; 3, laminated rubber; 4, a stepper, for example, as a vibration damping subject; and 5, an intermediate plate. FIGS. 9A and 9B respectively show a dynamics model of this structure and feedback control executed for this structure. This structure is disclosed in Japanese Patent Laid-Open No. 8-54039 (stiff actuator active vibration isolation system: U.S. Pat. No. 5,660,255). Using reference symbols in FIGS. 9A and 9B, equations of motion are given by:

$$M_P s^2 x = (K_i + C_i s)(v-x) + f_p \quad (1)$$

$$M_S s^2 v = K_S(z-v) + (K_i + C_i s)(x-v) \quad (2)$$

where $M_P$ is the mass of the vibration damping subject 4, $K_i$ is the spring constant of the laminated rubber 3, $C_i$ is the viscous damping coefficient of mainly the laminated rubber 3 between the vibration damping subject 4 and intermediate plate 5, $M_S$ is the mass of the intermediate plate 5, $K_S$ is the spring constant of the piezoelectric element 1, x is the displacement of the vibration damping subject 4, v is the displacement of the intermediate plate 5, u is the displacement of floor vibration, z is the displacement of the piezoelectric element 1, and $f_p$ is disturbance acting on the vibration damping subject 4.

Analysis will be again given first considering the technical contents disclosed in Japanese Patent Laid-Open No. 8-54039 (stiff actuator active vibration isolation system: U.S. Pat. No. 5,660,255). FIG. 9B is a block diagram that explains the feedback arrangement of the active vibration insulation device which uses the piezoelectric element as an actuator, as given by equations (1) and (2). As illustrated in FIG. 9B, there are two feedback loops. Using symbols in FIG. 9B, a feedback equation is given by:

$$z = u - C_d v - C_V s x \quad (3)$$

where $C_d$ is the feedback gain of the absolute displacement, and $C_v$ is the feedback gain of the absolute velocity. From equations (1) to (3), the relationship among the displacement x of the vibration damping subject, the displacement u of floor vibration, and the disturbance $f_p$ is given by:

$$x = \frac{(C_i s + K_i) K_s}{D(s)} \cdot u + \frac{M_S s^2 + C_i s + K_i + K_s(1+C_d)}{D(s)} \cdot f_p \quad (4)$$

$$D(s) = M_P M_S s^4 + (M_p + M_S) C_i s^3 + [M_P \{K_i + K_s(1+C_d)\} + M_S K_i + C_i K_s C_V] s^2 \{C_i K_S(1+C_d) + K_i K_S C_V\} s + K_i K_S(1+C_d) \quad (5)$$

From the above equations, the transmissibility from the displacement u of floor vibration to the displacement x of the vibration damping subject with the mass $M_P$ is defined by the first term of the right-hand side of equation (4). If s→0, the transmissibility in the DC range is given by:

$$\frac{x}{u} = \frac{1}{1+C_d} < 0 \text{ [dB]} \quad (6)$$

That is the transmissibility in the DC range can be set below 0 [dB] by adjusting the gain $C_d$. This is a critical difference from an anti-vibration device using an air spring or electromagnetic actuator. Normally, in an active anti-vibration device using an air spring as an actuator, damping is given by a vibration control loop based on detection of acceleration (absolute acceleration), and the designated posture is maintained by a position control loop based on the relative displacement between a floor and anti-vibration base. Since the relative displacement is fed back, the transmissibility in the low-frequency range is 0 [dB] but never falls below this value. Equation (6) can be implemented only because the absolute displacement is fed back at the gain $C_d$. In other words, a skyhook spring is implemented by feeding back the absolute displacement.

The skyhook spring can also be implemented in principle by, e.g., an anti-vibration device using an air spring as an actuator. That is, characteristics from the input to a servo valve for driving the air spring until the pressure at which the air spring is generated can be roughly considered as integral characteristics. Taking into account such characteristics, the acceleration of an anti-vibration base supported by the air spring is detected, and is negatively fed back to the input to the servo valve via integral compensation. With such feedback, the skyhook spring can also be implemented by an anti-vibration base using an air spring as an actuator in principle. However, in fact, there has been no report on implementation and actual operation of a skyhook spring in an anti-vibration device using a force generation actuator such as an air spring, electromagnetic motor represented by a linear motor, or the like. Displacement can be precisely controlled by using a piezoelectric element or the like that represents a displacement generation actuator, and hence, stiffness can also be precisely controlled. That is, it is difficult to implement a skyhook spring using a force generation actuator in practice.

The response from the disturbance $f_p$ to x is defined by the second term of the right-hand side of equation (4), and if s→0, the response in the DC range is given by:

$$\frac{x}{f_p} = \frac{1}{K_i} + \frac{1}{K_s(1+C_d)} \quad (7)$$

The above equation describes the compliance of a series spring system. The first term indicates the compliance of the hard rubber 3 inserted between the intermediate plate 5 and vibration damping subject 4, and the second term indicates the compliance of a spring between the piezoelectric element 1 and intermediate plate 5 and a spring produced by feedback. As can be seen from the second term, a spring $K_S$ between the piezoelectric element 1 and intermediate plate 5 and a spring $K_S C_d$ produced by the absolute displacement feedback are connected in parallel with each other. By increasing the gain $C_d$, the compliance given by equation (7) lowers and vibration damping characteristics improve. However, the magnitude of the compliance cannot become smaller than the first term.

From the above description, the effect of $C_d$ can be explicitly explained on the basis of the two static relations, i.e., equations (6) and (7).

The effect of $C_V$ will be explained below. The function of $C_V$ is obvious if one examines coefficients associated with the $s^2$ and s terms of characteristic equation (5) or refers to the block diagram in FIG. 9B. The viscous damping coefficient having a magnitude $K_S C_V$ is produced by feeding back the gain $C_V$. That is, damping is given to a mechanism to stabilize it.

With the above analysis, the conventional control technique disclosed by Japanese Patent Laid-Open No. 8-54039 (stiff actuator active vibration isolation system: U.S. Pat. No. 5,660,255) is understood. That is, damping is given to the mechanism by feeding back the absolute velocity of the gain $C_V$, and stiffness is electrically increased by feeding back the absolute displacement of the gain $C_d$, thereby making the transmissibility in the low-frequency range fall below 0 [dB].

Meanwhile, in the feedback arrangement shown in FIG. 7C, since the numbers of sensors and actuators are larger than those in FIG. 7B, the control characteristics can be improved. However, the feedback arrangement for such hybrid active vibration isolation device has not been fully explored yet.

An active vibration isolation device that assembles a piezoelectric element or the like as a representative displacement generation actuator has been extensively studied to be practically applied to semiconductor manufacturing apparatuses. However, a control technique that can fully exploit the feature of the piezoelectric element has not been established yet as compared to an active anti-vibration device using an air spring or electromagnetic actuator.

Especially, the control technique for a hybrid active vibration isolation device which uses both a displacement generation actuator represented by a piezoelectric element, and a force generation actuator represented by an electromagnetic motor leaves much to be desired, and the arrangement itself of a hybrid active vibration isolation device that can be applied to a semiconductor exposure apparatus has not been established yet.

The reason why a control technique that can sufficiently exploit the feature of the piezoelectric element has not been established as compared to the active anti-vibration device using an air spring or electromagnetic motor is as follows.

(1) Conventionally, in order to further improve vibration isolation characteristics of a vibration damping subject with unknown dynamics, an anti-vibration unit in an active vibration isolation device is additionally inserted, and no geometric information that pertains to the layout is obtained in advance of such information cannot be obtained.

(2) The anti-vibration unit itself constructs an interconnected dynamics system. That is, one anti-vibration unit has vibration detection means respectively for the floor, intermediate plate, and vibration damping subject. When a plurality of such anti-vibration units are used, how to get the dynamics of the individual intermediate plates to cooperate is indeterminate. However, from the standpoint that the dynamics of the vibration damping subject are thoroughly known, independent operations of a plurality of anti-vibration units mean idle operation; also, maximum anti-vibration characteristics cannot be obtained. That is, effective vibration isolation is hardly achieved. On the other hand, from the standpoint of positively introducing an anti-vibration unit, since information that pertains to the geometric layout of a plurality of anti-vibration units and the dynamics of the vibration damping subject are known, problem (1) above remains unsolved.

SUMMARY OF THE INVENTION

The present invention has been made in consideration of the above situation, and has as its object to provide an active anti-vibration device and its control method, which can implement effective vibration isolation using both a force generation actuator and a displacement generation actuator.

It is another object of the present invention to allow the force generation actuator to effectively exhibit anti-vibration performance.

It is still another object of the present invention to allow an anti-vibration device using a displacement element such as a piezoelectric element or the like as an actuator to effectively exhibit an anti-vibration function.

A hybrid active vibration isolation device according to one aspect of the present invention comprises an intermediate plate inserted between a vibration damping subject and a setting surface on which the vibration damping subject is set, an elastic body and force generation actuator inserted in parallel with each other between the vibration damping subject and intermediate plate, a displacement generation actuator inserted between the intermediate plate and setting surface, first, second, and third vibration detection means for respectively detecting vibrations of the vibration damping subject, intermediate plate, and setting surface, and feedback control means for driving the force generation actuator by a sum signal of signals obtained by performing predetermined compensation for outputs from the first and third vibration detection means, and driving the displacement generation actuator by a signal obtained by performing predetermined compensation for an output from the second vibration detection means.

A hybrid active vibration isolation device according to another aspect of the present invention comprises a plurality of anti-vibration units according to the aforementioned hybrid active vibration isolation device, and comprises first motion mode extraction arithmetic means for calculating a motion mode of the vibration damping subject on the basis of the outputs from the first vibration detection means of the respective anti-vibration units, a first PID compensator for performing predetermined compensation for signals that represent rigid body and elastic motions and output from the first motion mode extraction arithmetic means, first motion mode distribution arithmetic means for receiving the output from the first PID compensator, a driver for driving the force generation actuators of the respective anti-vibration units by receiving the output from the first motion mode distribution arithmetic means as an input, second motion mode extraction arithmetic means for cooperating the intermediate plates of the respective anti-vibration units on the basis of the outputs from the second vibration detection means of the respective anti-vibration units, a second PID compensator for performing predetermined compensation for the output from the second motion mode extraction arithmetic means, second motion mode distribution arithmetic means for receiving the output from the second PID compensator as an input, a high-voltage amplifier for making the displacement generation actuators of the respective anti-vibration units generate displacement on the basis of the output signal from the second motion mode distribution arithmetic means, and a third PID compensator for performing predetermined compensation for the outputs from the third vibration detection means of the respective anti-vibration units, which are added to the inputs to the driver.

According to this aspect, control that can fully exploit the feature of the force generation actuator can be made, and vibration isolation/vibration damping that can be applied to a semiconductor exposure apparatus or the like can be implemented. Also, the respective anti-vibration units can efficiently cooperate, thus achieving effective vibration isolation.

In order to achieve the above objects, according to still another aspect of the present invention, a vibration isolation device which sets a vibration damping subject, that is coupled to an intermediate plate via an elastic body, at a setting position via the intermediate plate and a displacement generation actuator, and drives the intermediate plate by the displacement generation actuator, detects vibration of the individual building components in a system from the vibration damping subject to the setting position, performs specific conversion for a vibration detection signal, and drives the displacement generation actuator by the converted signal.

According to one aspect, a displacement generation actuator active vibration isolation device of the present invention detects the absolute velocities of an intermediate plate and vibration damping subject, inputs the detection signals of these absolute velocities to corresponding PID compensators, and drives a displacement generation actuator on the basis of a sum signal of the outputs from the PID compensators.

According to another aspect, the apparatus detects the absolute accelerations of the intermediate plate and vibration damping subject, inputs the detection signals of these absolute accelerations to corresponding $PII^2$ compensator, and drives the displacement generation actuator on the basis of a sum signal of the outputs from the $PII^2$ compensators.

According to still another aspect, load sensors are provided between the vibration damping subject and an elastic body, and between the intermediate plate and displacement generation actuator, and the displacement generation actuator is driven on the basis of the, outputs from the load sensors. The outputs from the load sensors are supplied to corresponding $PII^2$ compensators like in the above aspect, and the displacement generation actuator can be driven based on a sum signal of the outputs from the $PII^2$ compensators.

According to still another aspect, the absolute acceleration of floor vibration at the setting position is detected, the detection signal of this absolute acceleration is input to a double integrator or double pseudo integrator, and the displacement generation actuator can be driven based on the output from the integrator.

According to still another aspect, the absolute velocity of floor vibration at the setting position is detected, the detection signal of this absolute velocity is input to an integrator or pseudo integrator, and the displacement generation actuator can be driven based on the output from the integrator.

According to still another aspect, smart units each using a displacement generation actuator are attached to a post and brace as mechanism members below a clean room where the vibration damping subject is set. The smart unit has a function of applying a force to the post or brace using a piezoelectric element or the like as an actuator and making it expand/contract or bend.

The above-mentioned vibration damping subject is a semiconductor manufacturing apparatus represented by a stepper, scanner, or the like. As the displacement generation actuator, a piezoelectric element, electrostrictive element, or the like is suitably used.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2A is a sectional view showing the structure of an active mount (anti-vibration unit) assembled with a piezoelectric element and electromagnetic motor of the device shown in FIG. 1;

FIG. 2B is a perspective view showing the structure of the active mount (anti-vibration unit) assembled with a piezoelectric element and electromagnetic motor of the device shown in FIG. 1;

FIGS. 7A to 7C are views showing the types of active vibration isolation device;

DETAILED DESCRIPTION OF THE PREFERRED EMBODIMENTS

Preferred embodiments of the present invention will now be described in detail in accordance with the accompanying drawings.

<First Embodiment>

In the first embodiment, a hybrid active anti-vibration device which combines a force generation actuator and displacement generation actuator will be explained.

In the first embodiment, an absolute velocity sensor is used as a vibration detection means. In this case, each compensation process of the hybrid active anti-vibration device is achieved by an independent PID compensator. When an acceleration sensor is used as a vibration detection means, an appropriate compensator can be selected in consideration of dimensions.

In order to achieve so-called perfect vibration isolation, i.e., to set zero transmissibility in the DC range, the integral gain of a PID compensator that compensates the absolute velocity of an intermediate plate, and the integral gain of a PID compensator that compensates the absolute velocity of a setting surface are optimally set in correspondence with the mechanical spring constant present between the intermediate plate and a vibration damping subject.

In order to broaden the anti-vibration range, an electrical spring constant produced by the integral gain of the PID compensator that compensates the absolute velocity of the setting surface is set to be equal to the spring constant of a displacement generation actuator, and an electrical viscous damping coefficient produced by a proportional gain of the PID compensator that compensates the absolute velocity of the intermediate plate is set to be equal to the viscous damping coefficient between the vibration damping subject and intermediate plate.

The vibration damping subject is a semiconductor manufacturing apparatus represented by a stepper, scanner, or the like. As the force generation actuator, for example, an electromagnetic motor can be used. As the displacement generation actuator, for example, a piezoelectric element can be used.

Figure 1:
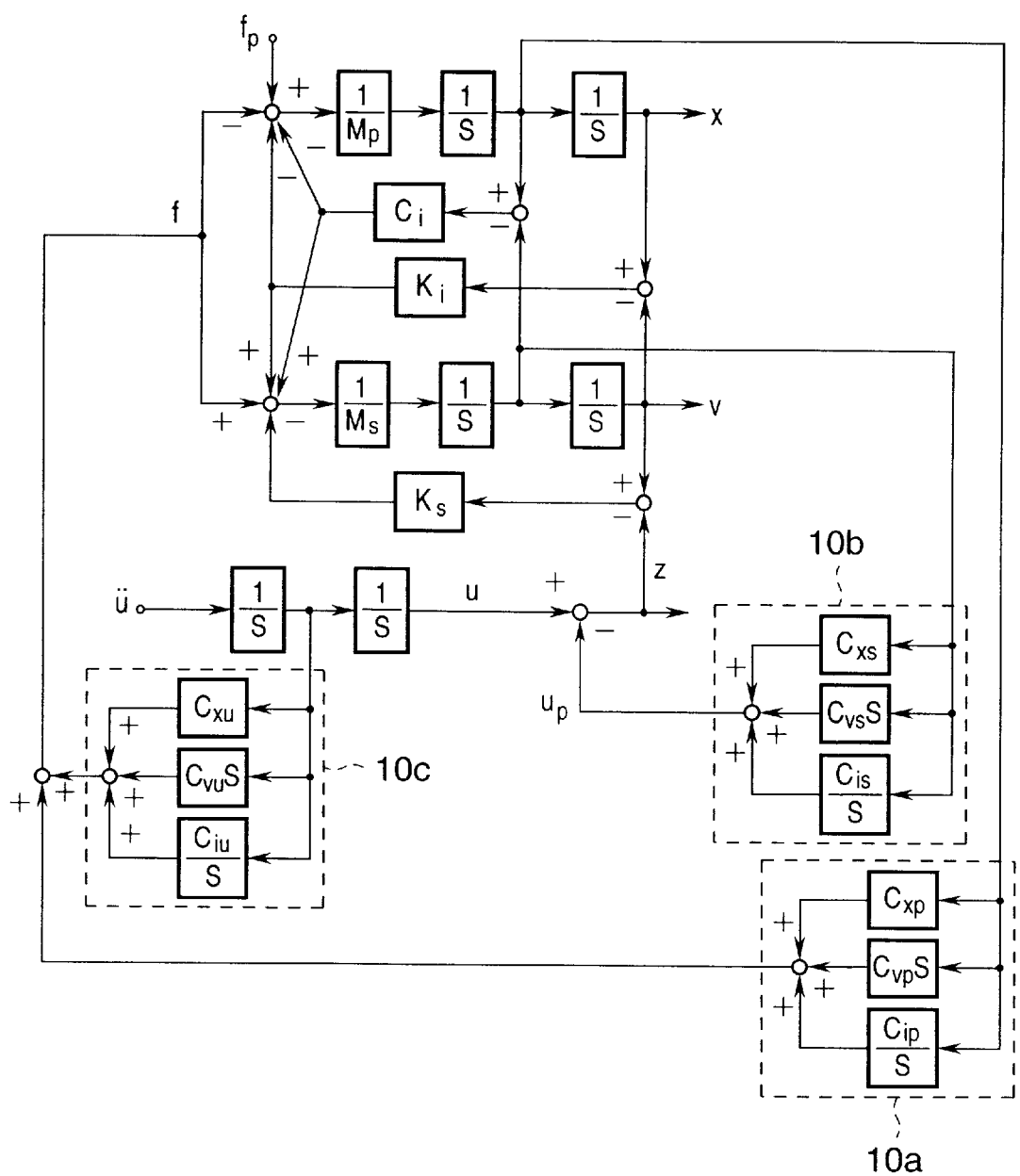
FIG. 1 is a block diagram of a hybrid active vibration isolation device according to the first embodiment of the present invention.
Figure 3:
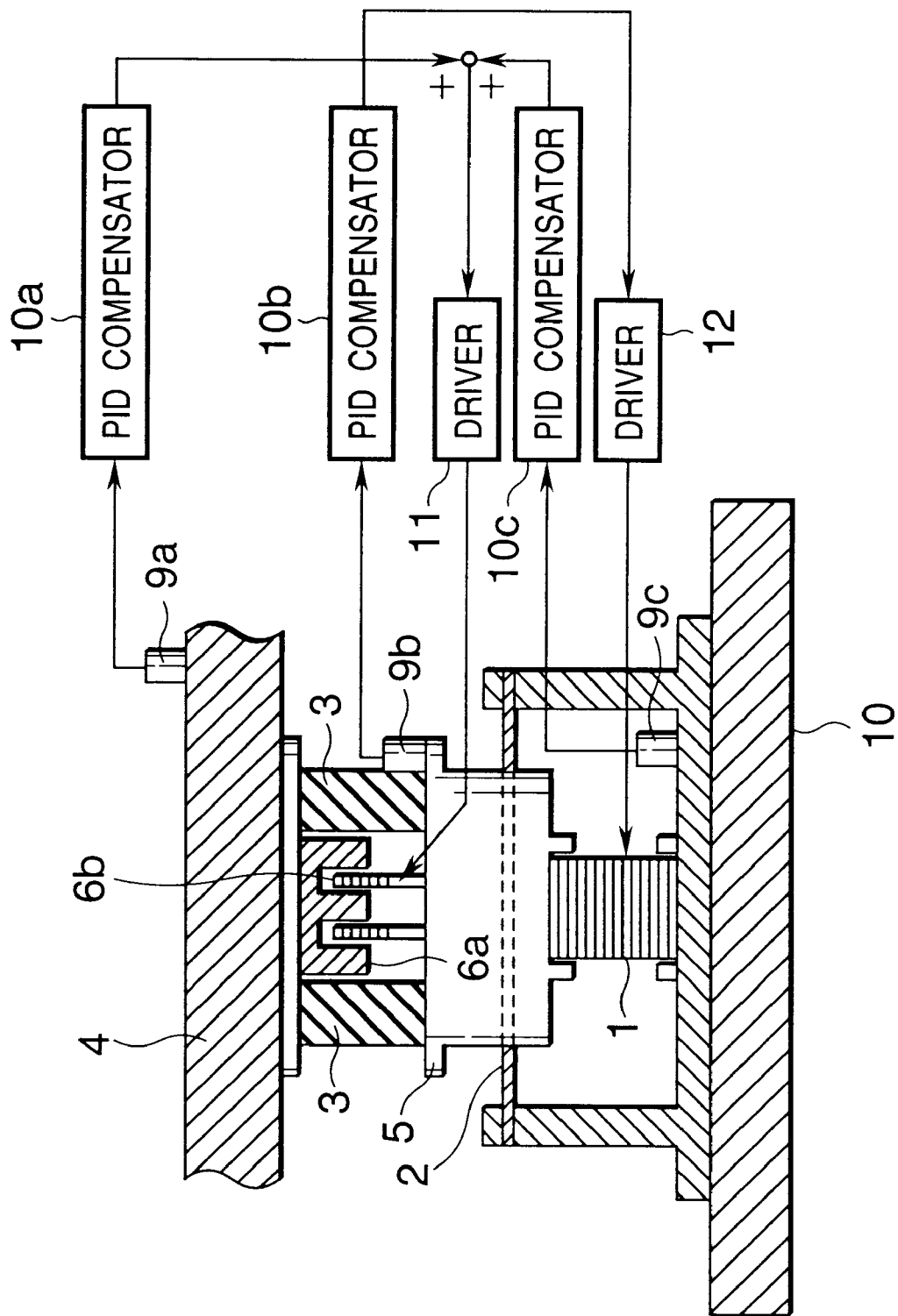
FIG. 3 is a view showing the arrangement of a controller for the device shown in FIG. 1.

FIG. 1 is a block diagram showing the feedback arrangement in a hybrid active vibration isolation device according to the first embodiment of the present invention. FIG. 2A is a sectional view showing the structure of an active mount (anti-vibration unit) of this device, and FIG. 2B is a perspective view of the active mount. FIG. 3 shows the arrangement of a controller for the active mount. This active mount corresponds to a dynamics system (dynamics model) shown in FIG. 7C, and the feedback control shown in FIG. 1 is applied to this dynamics system.

As shown in FIGS. 2A, 2B, and 3, this hybrid vibration isolation device, which drives an intermediate plate 5, to which a vibration damping subject 4 (e.g., a semiconductor manufacturing apparatus) is coupled via laminated rubber 3 and electromagnetic motors (6a, 6b), by a displacement generation actuator (piezoelectric element 1), comprises an absolute velocity sensor 9a serving as a vibration detection means set on the vibration damping subject 4, an absolute velocity sensor 9b set on the intermediate plate 5, and an absolute velocity sensor 9c for detecting vibration of a floor 10 on which the vibration damping subject 4 is set. The device also comprises a feedback controller for driving the electromagnetic motors by a sum signal of signals which are obtained by performing corresponding compensation processes for the outputs from the absolute velocity sensors 9a and 9b, and driving the piezoelectric element 1 by a signal obtained by performing compensation for the output from the absolute velocity sensor 9b.

Reference numeral 6a denotes a yoke; and 6b, a coil, which construct each electromagnetic motor. Referring to FIG. 3, reference numerals 10a, 10b, and 10c denote PID compensators for respectively compensating the outputs from the absolute velocity sensors 9a, 9b, and 9c; 11, a driver for energizing the electromagnetic motors; and 12, a driver for driving the piezoelectric element 1. Note that symbols in FIG. 7C have the following meanings. That is, $f_p$ is the disturbance force acting on the vibration damping subject 4, $M_P$ is the mass of the vibration damping subject 4, $K_i$ is the spring constant of a leaf spring and the laminated rubber, $C_i$ is the viscous damping coefficient of the laminated rubber, f is the driving force generated by the force generation actuator 6 (electromagnetic motors 6a and 6b), $M_S$ is the mass of the intermediate plate 5, and $K_S$ is the spring constant of the displacement generation actuator (piezoelectric element) 1.

Referring to FIG. 1, as in above equations (1) and (2), equations of motion of the anti-vibration unit (active mount) are given by:

$$M_p s^2 x = (K_i + C_i s)(v-x) + f_p + f \quad (8)$$

$$M_S s^2 v = K_S(z-v) + (K_i + C_i s)(x-v) - f \quad (9)$$

where x is the displacement of the vibration damping subject 4, v is the displacement of the intermediate plate 5, u is the displacement of the floor 10, and z is the displacement of the piezoelectric element 1.

The PID compensators 10a, 10b and 10c respectively compensate the absolute velocities output from the absolute velocity sensors 9a, 9b, and 9c for detecting vibrations of the vibration damping subject 4, intermediate plate 5, and the surface of the floor 10. That is, feedback rules are:

$$z = u - \left(C_{xs} + C_{vs}s + \frac{C_{is}}{s}\right)sv \quad (10)$$

$$f = -\left(C_{xp} + C_{vp}s + \frac{C_{ip}}{s}\right)sx - \left(C_{xu} + C_{vu}s + \frac{C_{iu}}{s}\right)su \quad (11)$$

Hence, relations among x, u, and $f_p$ can be obtained from equations (8) to (11). For the sake of simplicity, the characteristics in the DC range will be explained first to clarify superiority to the arrangement shown in FIG. 9 above.

Transmissibility x/u in the DC range s→0 is given by:

$$\frac{x}{u} = \frac{K_s[(1+C_{is})C_{iu} - K_i]}{K_s(1+C_{is})(K_i+C_{ip}) + K_i^2} \quad (12)$$

Hence, by adjusting gains $C_{iu}$ and $C_{is}$ to yield $(1+C_{is})C_{iu} = K_i$, the transmissibility in the DC range can be set at $-\infty$ [dB]. That is, floor vibration is not transmitted to the vibration damping subject at all ideally. This will be referred to as perfect vibration isolation hereinafter. The presence of such optimal values is not obvious analytically or experimentally in the conventional system, and characteristics superior to equation (6) can therefore be provided by the present invention.

On the other hand, the relationship from the disturbance $f_p$ to x, i.e., the characteristics of the compliance in the DC range s→0 are given by:

$$\frac{x}{f_p} = \frac{(K_s + K_s C_{is}) + K_i}{(K_s + K_s C_{is})(K_i + C_{ip}) + K_i^2} \quad (13)$$

As the gains $C_{ip}$ and $C_{is}$ increase, the compliance lowers and the vibration damping subject behaves more rigidly with respect to the disturbance $f_p$. If $C_{is}=0$ as a special case, equation (13) is rewritten as:

$$\frac{u}{f_p} = \frac{1}{K_i + \frac{K_s C_{ip}}{K_s + K_i}} \quad (14)$$

Equation (7) converges to $x/f_p = 1/K_i$ when $C_d \to \infty$. On the other hand, equation (14) can implement a compliance smaller than $1/K_i$ when $C_{ip}$ assumes a finite value. Hence, the hybrid active anti-vibration device of this embodiment which can obtain equation (14) is superior to that shown in FIG. 9.

An explanation that pertains to dynamics will be given below. From equations (8) to (1), x/u and $x/f_p$ are respectively given by:

$$\frac{x}{u} = \frac{b_4 s^4 + b_3 s^3 + b_2 s^2 + b_1 s + b_0}{a_4 s^4 + a_3 s^3 + a_2 s^2 + a_1 s + a_0} \quad (15)$$

$$\frac{x}{f_p} = \frac{c_2 s^2 + c_1 s + c_0}{a_4 s^4 + a_3 s^3 + a_2 s^2 + a_1 s + a_0} \quad (16)$$

Note that the parameters in equations (15) and (16) are respectively given by:

$$a_4 = (M_s + K_s C_{vs})(M_p + C_{vp}) \quad (17a)$$

$$a_3 = (M_s + K_s C_{vs})(C_i + C_{xp}) + C_i M_p + K_s C_{xs}(M_p + C_{vp}) \quad (17b)$$

$$a_2 = (M_s + K_s C_{vs})(K_i + C_{ip}) + K_s C_{xs}(C_i + C_{xp}) + (K_s + K_s C_{is})(M_p + C_{vp}) + K_i M_p \quad (17c)$$

$$a_1 = K_s C_{xs}(K_i + C_{ip}) + (K_s + K_s C_{is})(C + C_p) + K_i C_i \quad (17d)$$

$$a_0 = (K_s + K_s C_{is})(K_i + C_{ip}) + K_i^2 \quad (17e)$$

$$b_4 = (M_s + K_s C_{vs}) C_{vu} \quad (18a)$$

$$b_3 = (M_s + K_s C_{vs}) C_{xu} + K_s C_{xs} C_{vu} \quad (18b)$$

$$b_2 = (M_s + K_s C_{vs}) C_{iu} + K_s C_{xs} C_{xu} + (K_s + K_s C_{is}) C_{vu} \quad (18c)$$

$$b_1 = K_s C_{xs} C_{is} + (K_s + K_s C_{is}) C_{xu} - C_i K_s \quad (18d)$$

$$b_0 = (K_s + K_s C_{is}) C_{iu} - K_i K_s \quad (18e)$$

$$c_2 = (M_s + K_s C_{vs}) \quad (19a)$$

$$c_1 = (C_i + K_s C_{xs}) \quad (19b)$$

$$c_0 = (K_s + K_s C_{is} + K_i) \quad (19c)$$

In this way, the roles of the individual parameters of PID compensation can be known. More specifically, $C_{xs}$ is contribution to the damping term; $C_{vs}$ to the mass term; $C_{is}$ to the stiffness term; $C_{xp}$ to the damping term; $C_{vp}$ to the mass term; $C_{ip}$ to the stiffness term; $C_{xu}$ to the damping term; $C_{vu}$ to the mass term; and $C_{iu}$ to the stiffness term.

Since these parameters include those which do not nearly contribute to control performance, such parameters can be set at zero as needed. For example, when $C_{vs}=0$, $C_{vp}=0$, $C_{vu}=0$, and $C_{xu}=0$, the order of denominator and that of the numerator is 2 in the transfer function given by equation (15) is 4. Hence, the high-frequency characteristics in the frequency characteristics of the transmissibility can be attenuated along a curve of 40 [dB/dec]. Refer to equation (18d) in this case.

Since $b_1=0$ can be set by adjusting gains to obtain:

$$C_{iu} = K_s \quad (20a)$$

$$K_s C_{xs} = C_i \quad (20b)$$

the transmissibility in the middle-frequency range can be improved. When this setup is made, $b_0=0$ cannot be set, because $K_s \gg K_i$. However, equations (20a) and (20b) are also optimal values since they can broaden the anti-vibration range, and respectively adjust the electrical spring constant produced by the integral gain of the PID compensator 10c to be applied to the absolute velocity of floor vibration to equal $K_s$, and the electrical viscosity produced by the proportional gain of the PID compensator 10b to be applied to the absolute velocity of the intermediate plate 5 to equal $C_i$. Upon determining the above formulas, absolute velocity signals are detected, and the detected signals undergo PID compensation processes. However, upon detecting the absolute accelerations, appropriate compensators can be selected in consideration of dimensions. Furthermore, air springs may be used as force generation actuators in place of the electromagnetic motors 6a and 6b.

Figure 4:
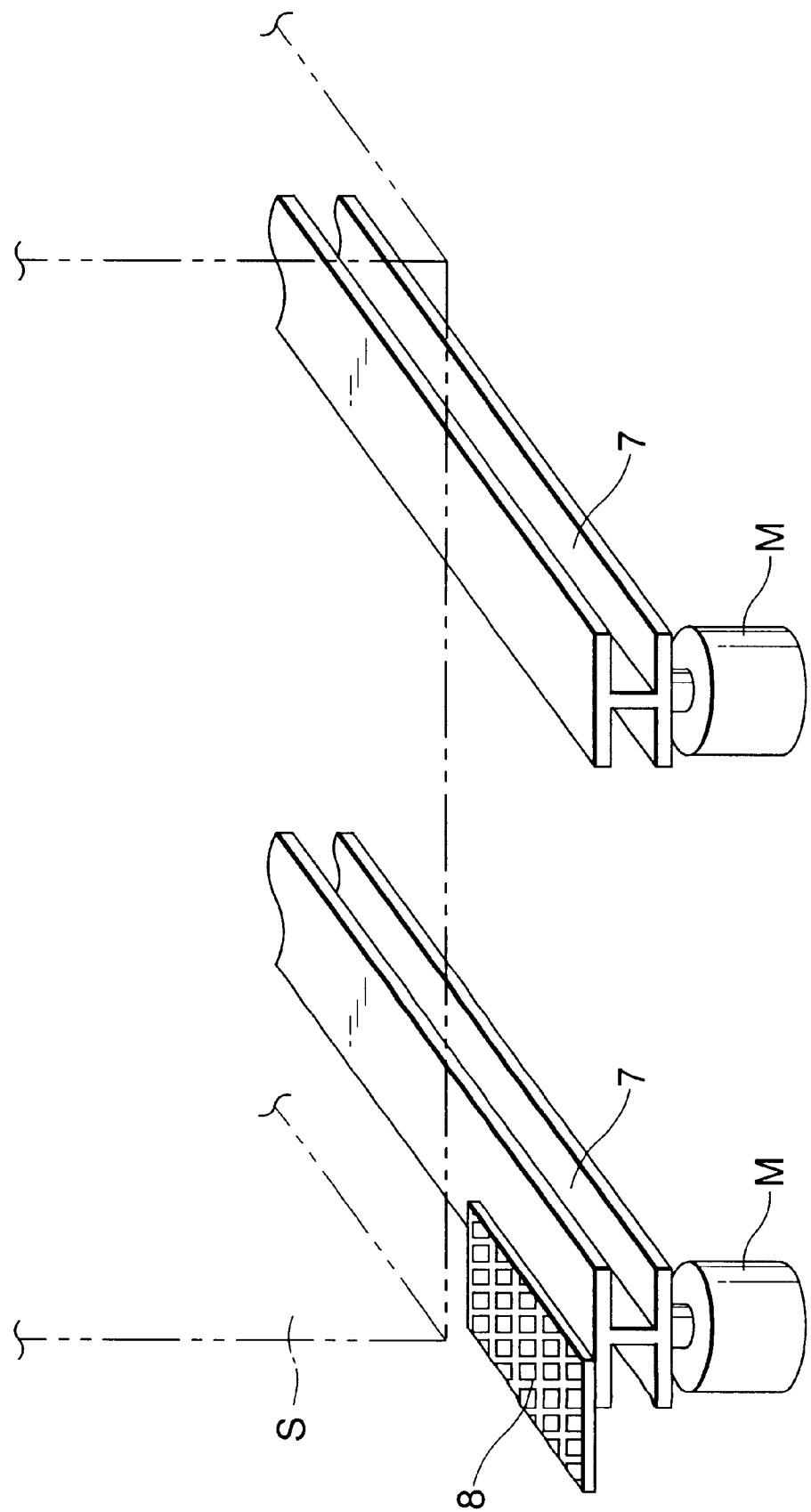
FIG. 4 is a perspective view showing an example of the active mount (anti-vibration unit) shown in FIGS. 2A and 2B built in a semiconductor manufacturing apparatus.

Note that the hybrid active vibration isolation device of this embodiment is used to support the entire semiconductor exposure apparatus. For example, as shown in FIG. 4, a plurality of active mounts M (to be also referred to as anti-vibration units M hereinafter) shown in FIGS. 2A and 2B are used in the vertical and horizontal directions to sufficiently damp vibrations which propagate to a semiconductor exposure apparatus S. Note that reference numeral 7 denotes a beam; and 8, a grating.

Figure 5:
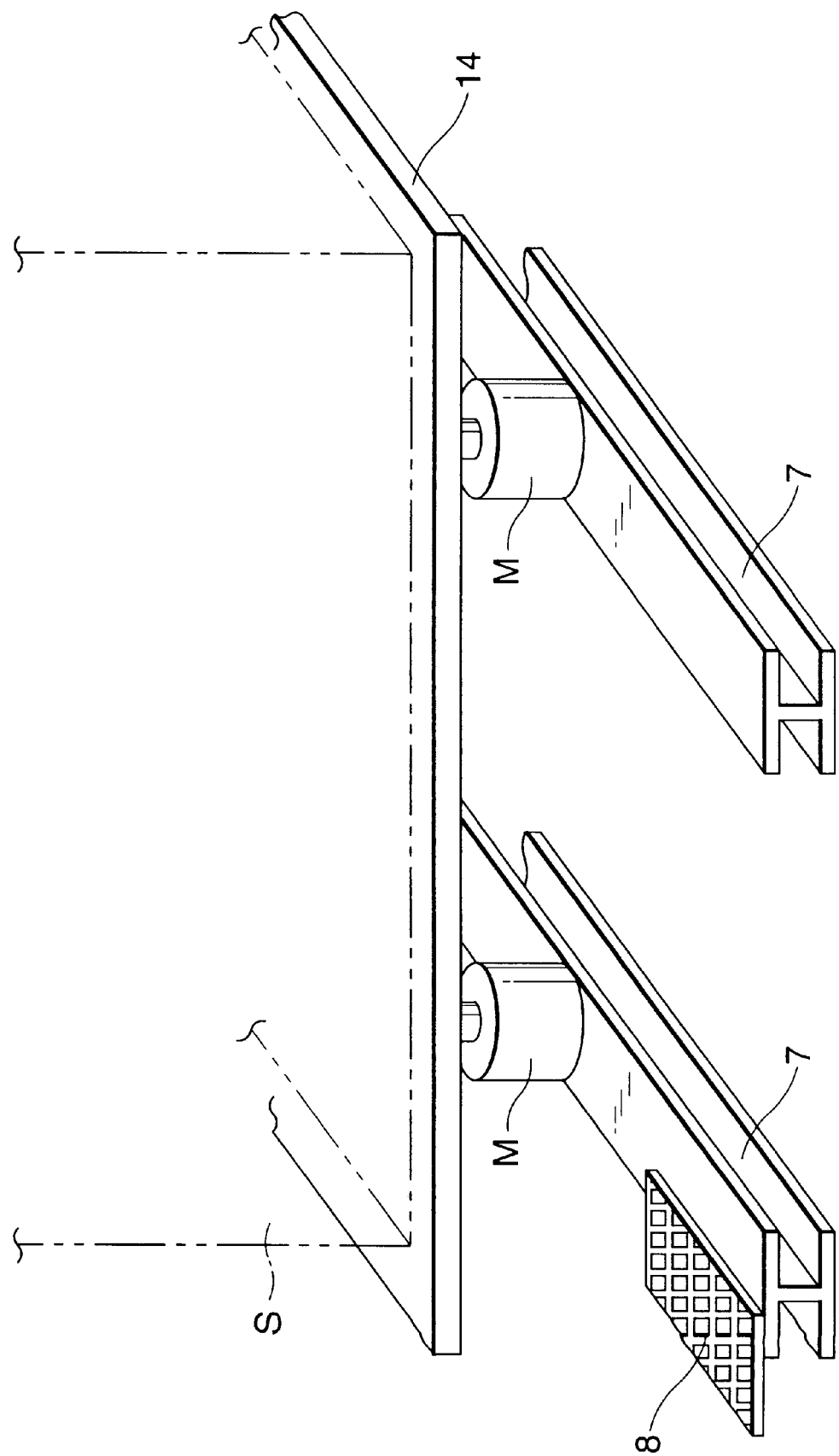
FIG. 5 is a perspective view showing an example of the active mount (anti-vibration unit) shown in FIGS. 2A and 2B built in a semiconductor manufacturing apparatus.

Or as shown in FIG. 5, a floor surface on which a semiconductor manufacturing apparatus S is set is constructed by beams 7 and a grating 8, the semiconductor manufacturing apparatus S is placed on a vibration damping steel plate 14 to prevent vibration of that floor surface from propagating to the semiconductor manufacturing apparatus S, and a plurality of anti-vibration units M shown in FIGS. 2A and 2B are inserted between the gratings 8 and the vibration damping steel plate 14. The reason why the semiconductor manufacturing apparatus S is supported is that many vibration isolation means are required to stand against a worse vibration environment upon setting the semiconductor manufacturing apparatus S in a multistory building, or to lower allowable floor vibration levels due to miniaturization of the semiconductor manufacturing apparatus. However, conventionally, the plurality of anti-vibration units M independently function, and do not always efficiently damp propagation of vibration of the floor surface to the vibration damping steel plate 14. The conventional anti-vibration units M are placed under the vibration damping steel plate 14, and the layout positions of the anti-vibration units M under the vibration damping steel plate 14 are not optimized. In addition, the individual anti-vibration units do not always operate in consideration of their spatial layout. An embodiment that can solve such problems will be explained below.

Figure 6:
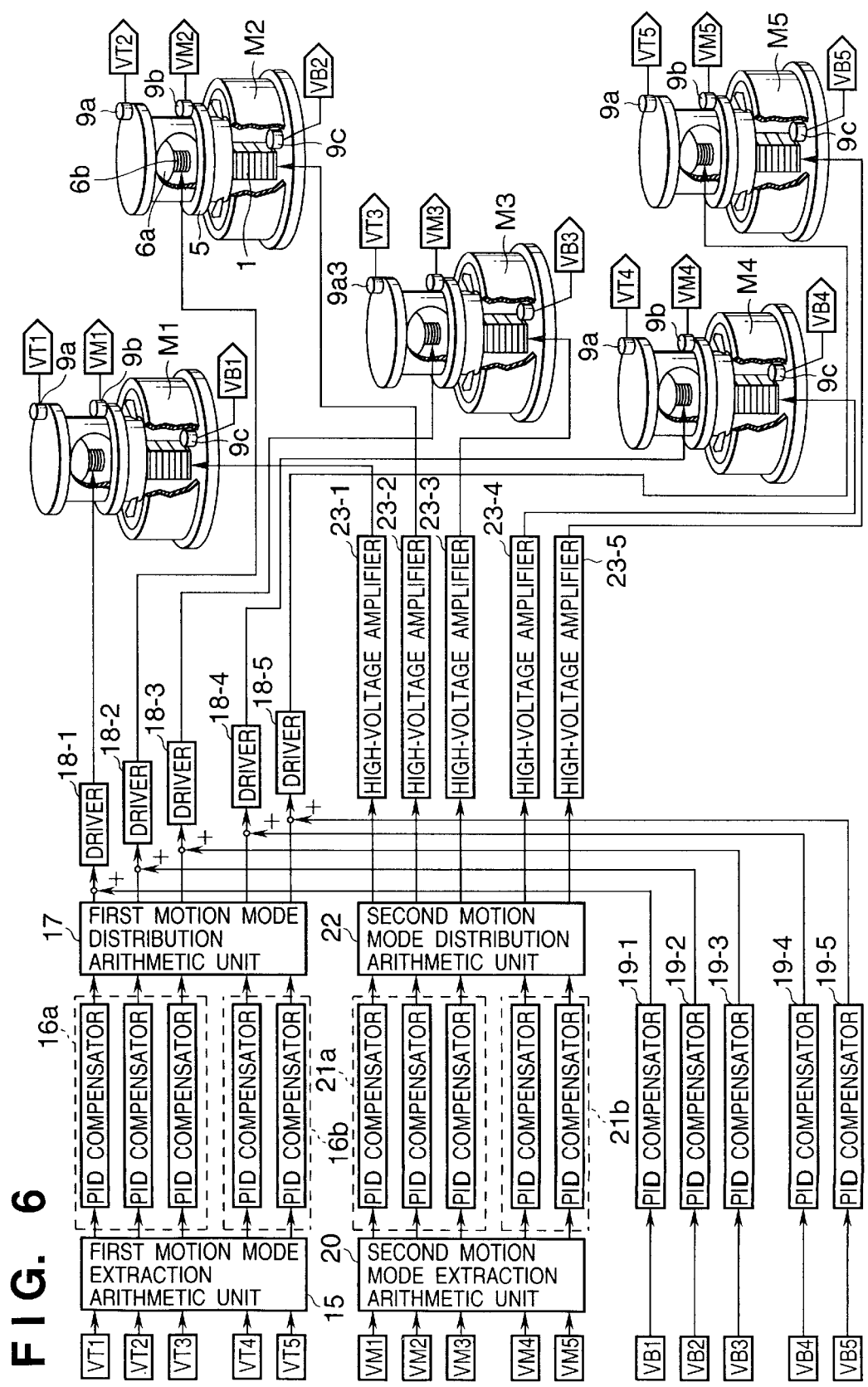
FIG. 6 is a block diagram for explaining the arrangement of an active vibration isolation device constructed using a plurality of active mounts shown in FIGS. 2A and 2B.

FIG. 6 shows the arrangement of a hybrid active vibration isolation device according to another embodiment of the present invention. In this arrangement, five anti-vibration units shown in FIGS. 2A and 2B are used. In the above embodiment, the electromagnetic motors 6a and 6b and piezoelectric element 1 in each anti-vibration unit are driven by feedback control based on output signals from the vibration detection means in the identical anti-vibration unit. Since the dynamics of the vibration damping subject itself and the vibration environment of the apparatus setting floor are unknown, vibration that propagates to the layout position of each anti-vibration unit is damped by each unit, thus consequently damping vibration of the entire vibration damping subject supported by the plurality of anti-vibration units. However, in order to attain more effective and efficient vibration damping, all the anti-vibration units must cooperate with each other in place of solely exhibiting their anti-vibration function, so as to obtain effective anti-vibration performance. FIG. 6 provides such arrangement.

Referring to FIG. 6, five anti-vibration units M1 to M5 are used, and a vibration damping subject (not shown; e.g., a semiconductor manufacturing apparatus S shown in FIG. 5) is placed on the vibration detection side of the absolute velocity sensor 9a of each unit. Of course, the number of anti-vibration units is not limited to five. Also, the anti-vibration direction is not limited to the vertical direction.

As shown in FIG. 6, outputs VT1 to VT5 from individual absolute velocity sensors 9a on the vibration damping subject side are input to a first motion mode extraction arithmetic unit 15. This arithmetic unit detects a rigid body motion mode signal of a vibration damping steel plate 14 (see FIG. 5) that supports the semiconductor manufacturing apparatus S as a vibration damping subject, and a flexible elastic motion mode signal on the basis of these inputs, and outputs the detected motion mode signals. These motion mode signals are supplied to first PID compensators 16a and 16b, and parameters are adjusted in units of motion modes. The PID compensators 16a compensate for vertical translation and rotation in the plane of the vibration damping steel plate 14 in the rigid body motion mode, and the PID compensators 16b make compensation for the elastic motion mode. As the number of anti-vibration units M increases, the number of controllable elastic modes increases.

Subsequently, the outputs from the first PID compensators 16a and 16b are supplied to a first motion mode distribution arithmetic unit 17, which generates inputs to drivers 18-1 to 18-5 for energizing the electromagnetic motors 6a and 6b in the anti-vibration units M1 to M5. On the other hand, vibrations VB1 to VB5 output from absolute velocity sensors 9c as third vibration detection means for detecting vibration of the surface of the floor 10 in the anti-vibration units M1 to M5 are respectively input to third PID compensators 19-1 to 19-5 to undergo parameter adjustment, and are then added to nodes after the first motion mode distribution arithmetic unit 17 and before the drivers 18-1 to 18-5. Furthermore, vibrations VM1 to VM5 of intermediate plates 5 of the anti-vibration units M1 to M5 are detected by absolute velocity sensors 9b as second vibration detection means, and are input to a second motion mode extraction arithmetic unit 20. The outputs from the arithmetic unit 20 undergo parameter adjustment by second PID compensators 21a and 21b, and are then input to a second motion mode distribution arithmetic unit 22. The output signals from the arithmetic unit 22 energize high-voltage amplifiers 23-1 to 23-5 for producing displacements in piezoelectric elements 1 of the anti-vibration units M1 to M5.

In the above-mentioned feedback control, the electromagnetic motors are independently driven based on the outputs VB1 to VB5 from the absolute velocity sensors 9c as the third vibration detection means for floor vibration in units of anti-vibration units. On the other hand, as for vibrations of the intermediate plates 5 and vibration damping subject setting side of the anti-vibration units M1 to M5, the piezoelectric elements 1 and electromagnetic motors 6a and 6b are driven by the outputs from the first and second PID compensators based on the motion modes. The signals VT1 to VT5 detected by the absolute velocity sensors 9a as the first vibration detection means indicate vibration of the vibration damping subject as a continuous body placed on the plurality of anti-vibration units, and the rigid body motion mode and elastic mode can be detected from these signals. However, the vibrations VM1 to VM5 detected by the absolute velocity sensors 9b as the second vibration detection means indicate not vibrations of an intermediate plate as a continuous body but those of the intermediate plates 5 which are physically separate from each other. However, in this arrangement, the vibrations of the individual intermediate plates 5 are supplied to the second motion mode extraction arithmetic unit 20 to extract pseudo rigid body and elastic motion modes, and these modes are supplied to the second PID compensators 21a for the rigid body motion mode and the second PID compensators 21b for the elastic motion mode. The physically separated intermediate plates 5 are controlled as if they were an integrated intermediate plate which has a rigid body motion mode and elastic motion mode as a continuous body.

In this manner, since the motions of the intermediate plates 5 of the anti-vibration units M1 to M5 are controlled based on the rigid body and elastic motion modes, and the vibration damping subject placed above the intermediate plate 5 is also controlled based on the rigid body and elastic motion modes, propagation of floor vibration to the vibration damping subject can be damped at a good prospect.

The effects of the present invention are as follows.

(1) The hybrid active vibration isolation device of the present invention has an arrangement which is highly versatile and can be satisfactorily applied to a semiconductor exposure apparatus.

(2) In general, in an active vibration isolation device in which an elastic body is inserted between an intermediate plate and vibration damping subject, the high-frequency anti-vibration range is narrowed down by the natural frequency which is higher than the primary resonance frequency and is caused by the elastic body. However, the hybrid active vibration isolation device of the present invention can damp this resonance, thus further broadening the anti-vibration range.

(3) Since the parameter setting conditions of the PID compensators, which make propagation of floor vibration in the DC range to the vibration damping subject zero, and the parameter conditions for minimizing the transmissibility in the middle-frequency range are clearly defined, optimal anti-vibration characteristics can always be obtained.

(4) According to the hybrid active vibration isolation device of the present invention, since the motions of a plurality of anti-vibration units that support a semiconductor exposure apparatus or the like are associated with each other, optimal adjustment can be done in correspondence with the vibration state of the apparatus setting surface. More specifically, the motions of the intermediate plates of the anti-vibration units are associated with each other, and vibration isolation can be attained based on rigid body and elastic motions of the vibration damping subject located above the intermediate plates.

(5) Therefore, since vibration of the floor on which the semiconductor manufacturing apparatus is set can be reduced by equipping the hybrid active vibration isolation device of the present invention, ICs can be printed with high precision, and the yield can be improved, thus greatly contributing to high productivity.

<Second Embodiment>

In the second embodiment, an active anti-vibration device using a displacement generation actuator will be explained. In an anti-vibration device of this type, the absolute displacement of an intermediate plate and the absolute velocity of a vibration damping subject are fed back to respectively implement a skyhook spring and skyhook damper. In a displacement generation actuator active vibration isolation device of the second embodiment, the absolute displacements, absolute velocities, and absolute accelerations of the intermediate plate and vibration damping subject are fed back to implement a more versatile system. The second embodiment will be explained below with reference to FIG. 10. Equations of motion are the same as equations (1) and (2). These equations are given again:

$$M_p s^2 x = (K_i + C_i s)(v-x) + f_p \qquad (21)$$

$$M_s s^2 v = K_s(z-v) + (K_i + C_i s)(x-v) \qquad (22)$$

Figure 10:
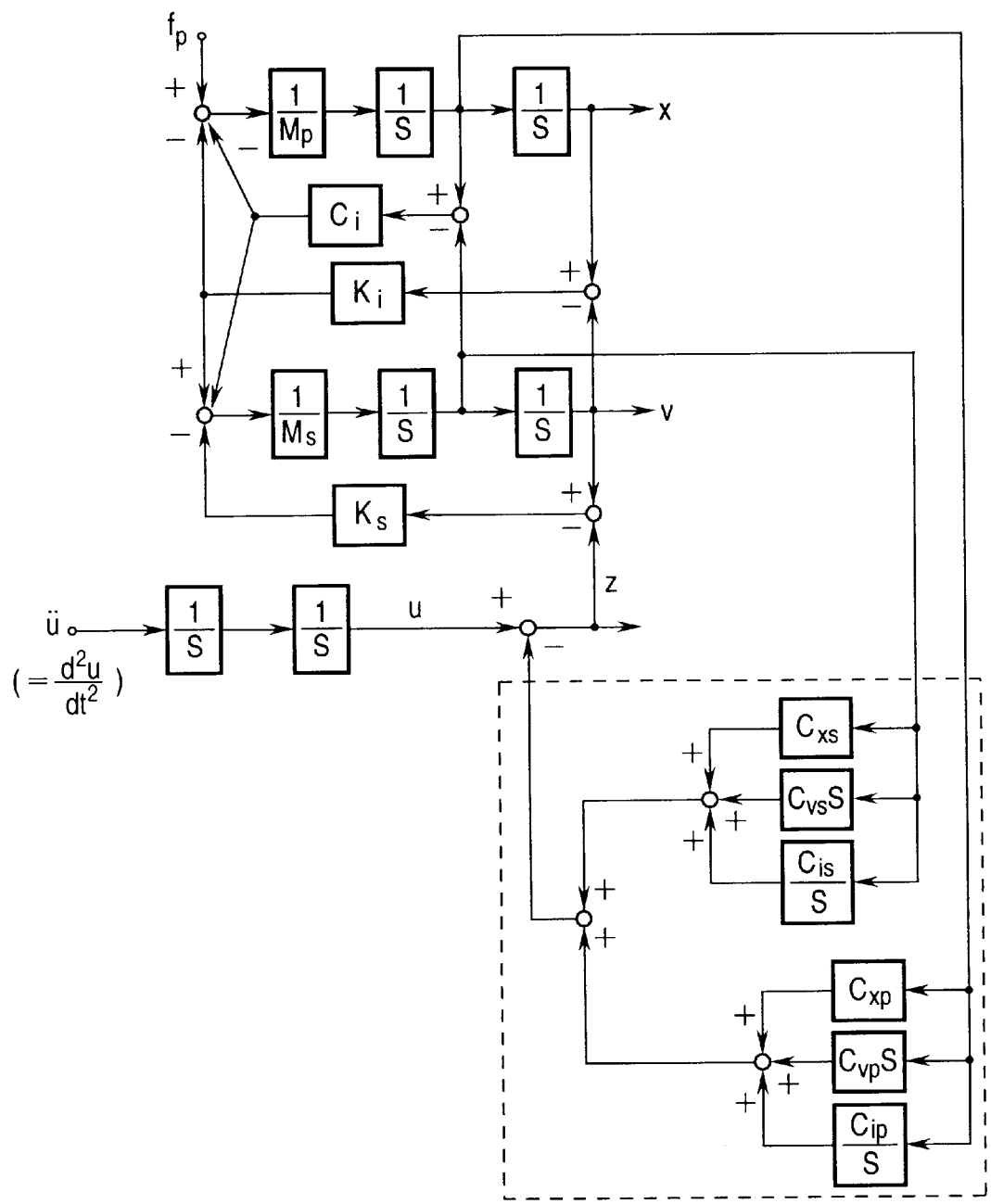
FIG. 10 is a block diagram showing the feedback arrangement of a displacement generation actuator active vibration isolation device according to the second embodiment of the present invention.

In this embodiment, feedback using the generation rule of displacement to be generated by a piezoelectric element, i.e., symbols in FIG. 10, is given by:

$$z = u - \left(C_{xs} + C_{vs}s + \frac{C_{is}}{s}\right)sv - \left(C_{xp} + C_{vp}s + \frac{C_{ip}}{s}\right)sx \qquad (23)$$

In this case, the absolute velocity sx of the vibration damping subject and the absolute velocity sv of the intermediate plate are detected as fundamental parameters, and undergo PID compensation. P means proportional operation, I integral operation, and D derivative operation.

For example, a geophone sensor can be used to detect the absolute velocity.

As a vibration detection means other than the geophone sensor, an acceleration sensor can be generally used. For example, a servo acceleration sensor is available. This sensor basically detects an acceleration signal literally, but can also detect an absolute velocity. Hence, detecting the absolute velocities sx and sv and performing compensation given by equation (23) for these detection signals is a practical feedback process.

As is apparent from comparison between equations (23) and (3), conventional feedback control given by equation (3) corresponds to a case wherein $C_{xp} \rightarrow C_v$, $C_{vp} \rightarrow 0$, $C_{ip} \rightarrow 0$, $C_{xs} \rightarrow 0$, $C_{vs} \rightarrow 0$, and $C_{is} \rightarrow C_d$, and hence, equation (23) of this embodiment is highly versatile feedback control that covers equation (3).

Based on equation (21) to (23), as in equation (4), the relationship among a displacement x of the vibration damping subject, a displacement u of floor vibration, and a disturbance $f_p$ is given by:

$$x = \frac{(C_{is} + K_i)K_s}{d(s)} \cdot u + \qquad (24)$$

$$\frac{(M_s + K_s C_{vs})s^2 + (C_i + K_s C_{xs})s + K_i + K_s(1 + C_{is})}{d(s)} \cdot f_p$$

for $$d(s) = M_p(M_s + K_s C_{vs})s^4 + \{(M_s + K_s C_{vs})C_i + M_p(C_i + K_s C_{xs}) + C_i K_s C_{vp}\}s^3 + \{(M_s + K_s C_{vs})$$

$$K_i + C_i K_s C_{xs} + (K_i + K_s + K_s C_{is})M_p + K_i K_s C_{vp} + C_i K_s C_{xp}\}s^2 + \{K_s C_{xs} K_i + K_s C_i + K_s C_{is} C_i$$

$$+ K_i K_s C_{xp} + C_i K_s C_{ip}\}s + K_i K_s(1 + C_{is} + C_{ip}) \qquad (25)$$

At this time, the transmissibility in the DC range is given by:

$$\frac{x}{u} = \frac{1}{1 + C_{is} + C_{ip}} < 0 \text{ [dB]} \qquad (26)$$

A special case in which $C_{ip} \rightarrow 0$ and $C_{is} \rightarrow C_d$ are replaced in equation (26) corresponds to equation (6). Compared to the feedback control that obtains equation (6), the DC anti-vibration range can be broadened.

On the other hand, the characteristics in the DC range from $f_p$ to x, i.e., the compliance is given by:

$$\frac{x}{f_p} = \frac{1}{K_i\left(1 + \frac{C_{ip}}{1 + C_{is}}\right)} + \frac{1}{K_s(1 + C_{is} + C_{ip})} \qquad (27)$$

As can be easily understood from the above description, letting $C_{ip} \rightarrow 0$ and $C_{is} \rightarrow C_d$ in this equation, the equation matches equation (7). Also by increasing $C_{ip}$, i.e., the gain, the compliance given by equation (27) can be lowered. Also, since $d(x/f_p)/dC_{is}<0$, the compliance given by equation (27) can be lowered by increasing $C_{is}$.

Figure 8:
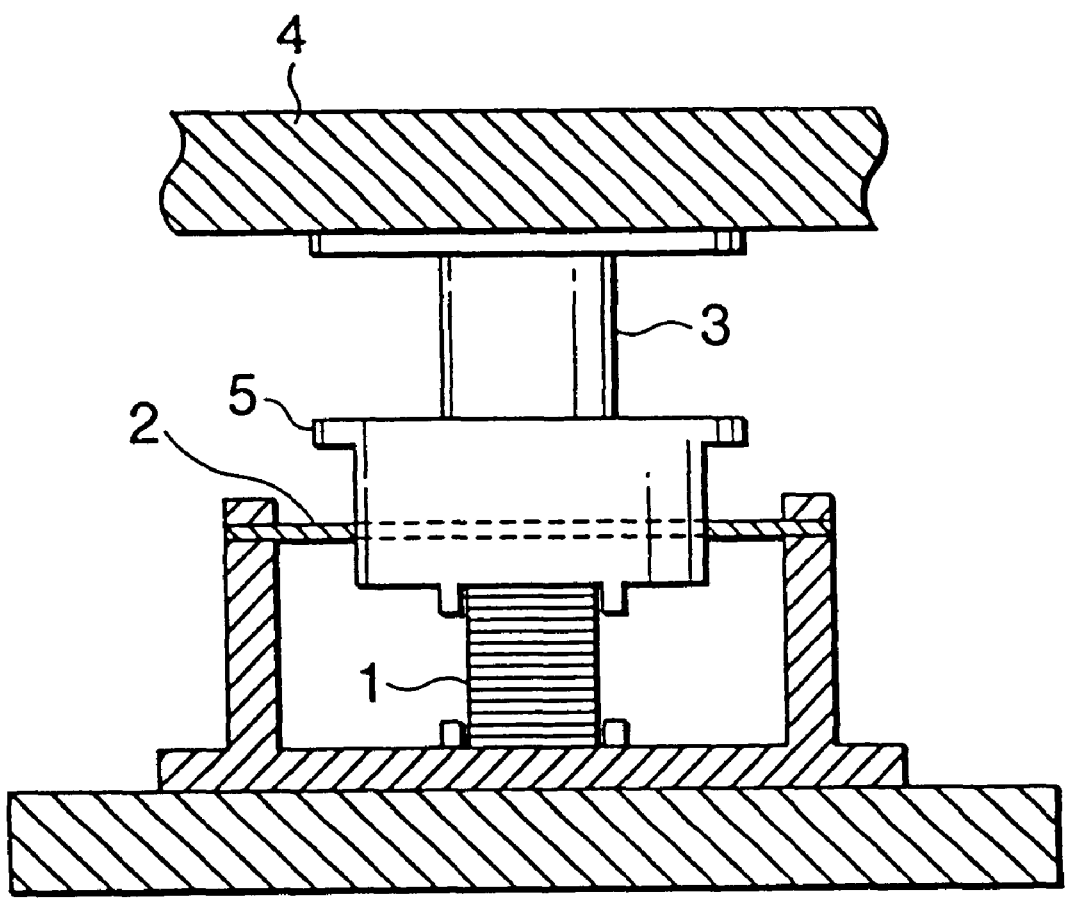
FIG. 8 is a sectional view showing an example of the structure of a general active mount assembled with a piezoelectric element.

As can be immediately understood from equations (26) and (27), the roles of $C_{ip}$ and $C_{is}$ are to impart rigidity. The roles of other parameters are apparent from characteristic equation d(s) (equation 25) or dynamic interpretation of the block diagram of FIG. 10, and are:

$C_{xp}$: contribution to the viscous term
$C_{vp}$: contribution to the mass term
$C_{xs}$: contribution to the viscous term
$C_{vs}$: contribution to the mass term In the above description, a feedback device to be applied to a one-vertical-axis dynamics model has been explained. The same applies to a horizontal feedback device. In order to control the postures of the vibration damping subject in six axes, a plurality of active mounts, each of which includes a vertical active mount shown in FIG. 8, and a horizontal active mount having nearly the same structure (not shown) in one unit, are used. Examples of the active mount units built in a semiconductor manufacturing apparatus are as shown in FIGS. 4 and 5. In FIG. 4, a semiconductor manufacturing apparatus is set on a grating 8 in a clean room. As shown in FIG. 4, a plurality of active mount units M are placed under beams 7 underneath the grating 8. In FIG. 5, a semiconductor manufacturing apparatus S is placed on a vibration damping steel plate 14, and a plurality of active mount units M are inserted between the grating 8 and vibration damping steel plate 14.

<Third Embodiment>

Figure 11:
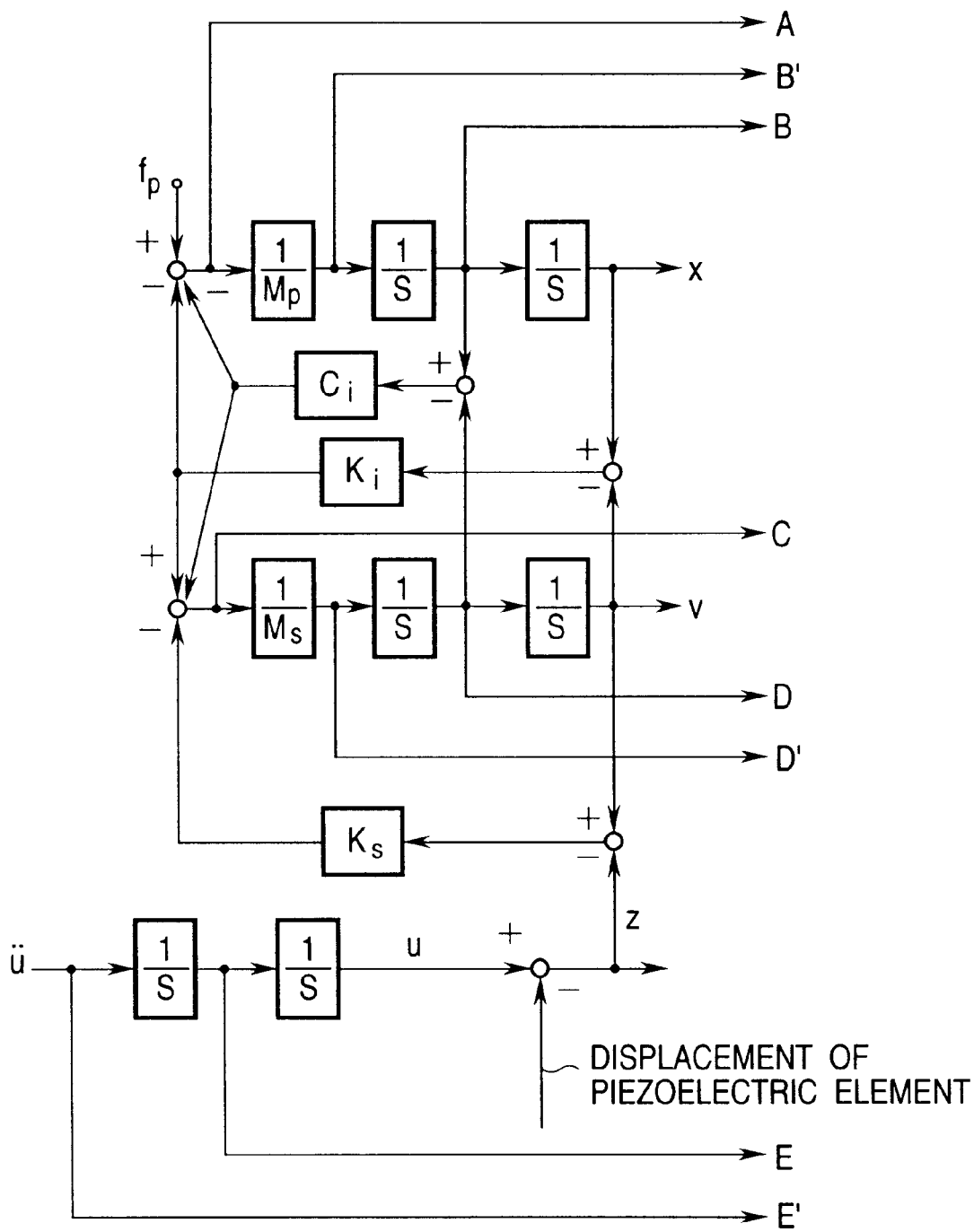
FIG. 11 is a block diagram for explaining the sensor output that can be used in the third embodiment.

The second embodiment is achieved on the condition that the velocity sensor (e.g., a geophone sensor) is used as the vibration detection means. That is, velocity signals B and D shown in FIG. 11 are detected and are used as feedback signals. However, as the vibration detection means, a servo acceleration sensor can be used more prevalently. In this case, as has been described in the second embodiment, a servo acceleration sensor can output a velocity signal, and the obtained velocity signal can be fed back according to equation (23). When the servo acceleration sensor detects an acceleration signal literally, this signal can be fed back by $$z = u - \left(\frac{C_{xp}}{s} + C_{vp} + \frac{C_{ip}}{s^2}\right)s^2 x - \left(\frac{C_{xs}}{s} + C_{vs} + \frac{C_{is}}{s^2}\right)s^2 v \quad (28)$$

That is, a $PII^2$ compensator is implemented.

Figure 12:
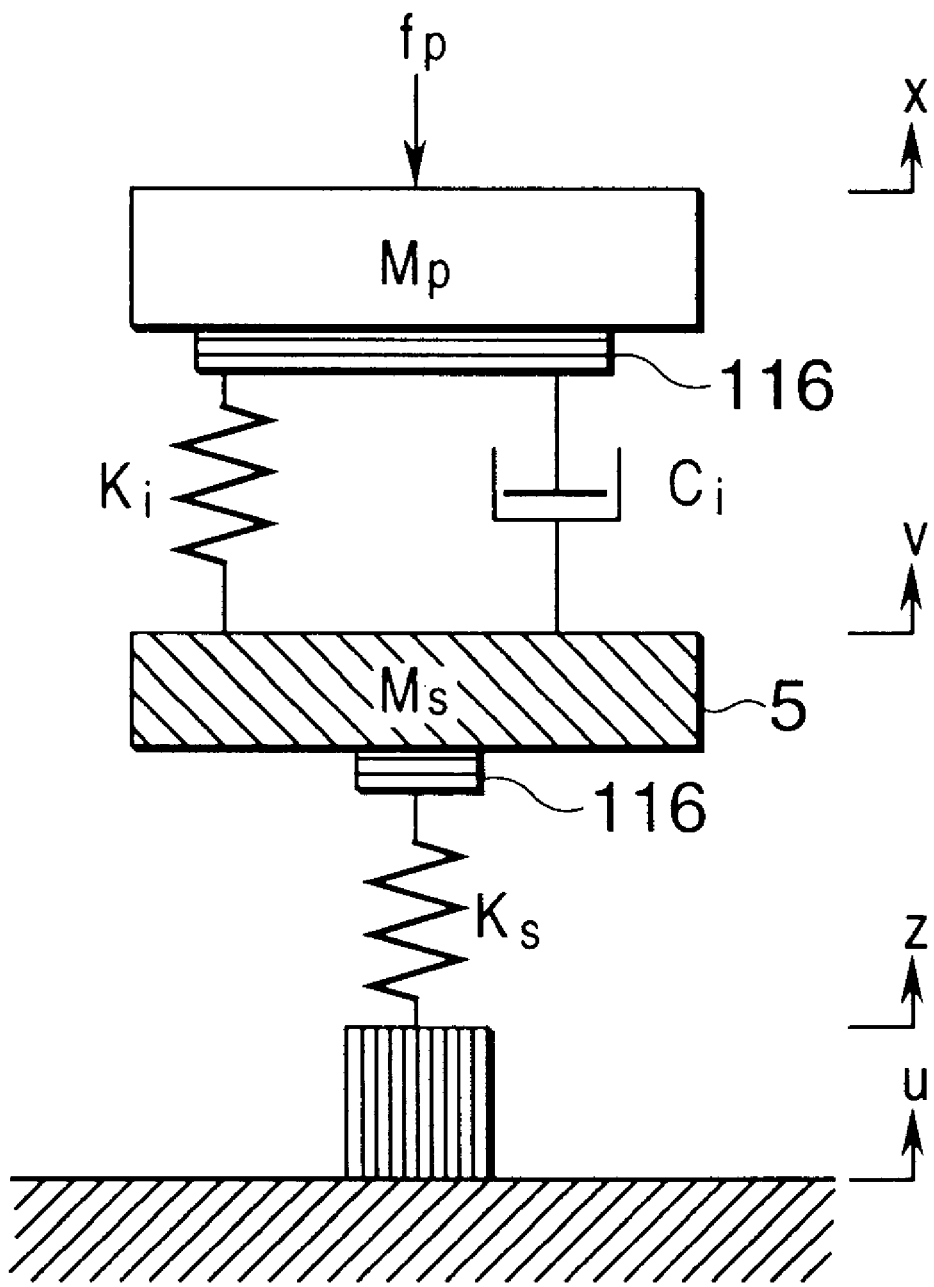
FIG. 12 is a view showing a dynamics model when an active vibration isolation device using a piezoelectric element as an actuator comprises a load sensor.

More specifically, acceleration signals B' and D' in FIG. 11 are detected, and can be used as feedback signals. If the signals B' and D' can be used as feedback signals, since signals A and C have the same nature as the acceleration signals B' and D', they can be used as feedback signals. The signals A and C are loads acting on the vibration damping subject and intermediate plate, and can be easily extracted by attaching load sensors. FIG. 12 shows the dynamics model. As shown in FIG. 12, loads acting on the intermediate plate with a mass $M_s$ and the vibration damping subject with a Mass $M_p$ can be detected by load sensor 116, and their outputs are fed back according to equation (28).

<Fourth Embodiment>

Figure 9A:
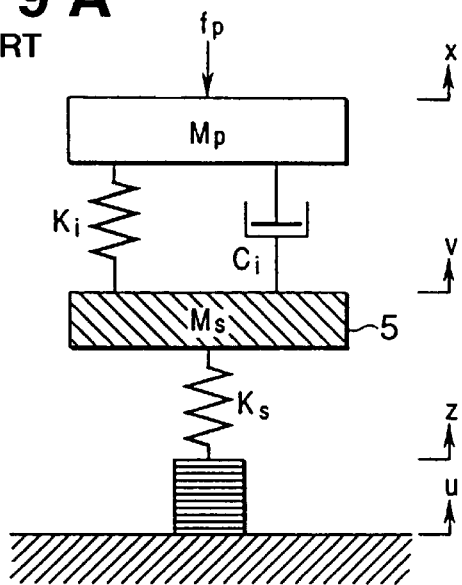
FIG. 9A is a view showing a dynamics model of the structure shown in FIG. 8.
Figure 9B:
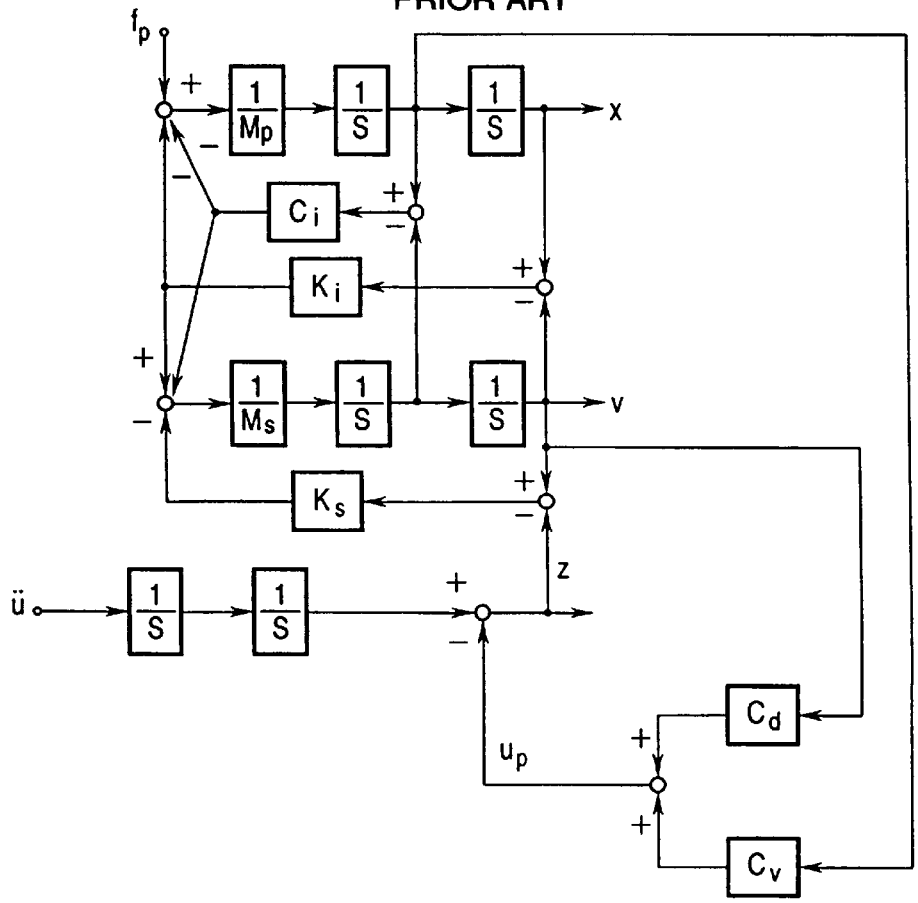
FIG. 9B is a block diagram showing the feedback arrangement of the structure shown in FIG. 8.

Both the feedback mechanisms in FIGS. 10 and 9 are based on the concept of output damping, i.e., damping propagation of floor vibration u at the position of the displacement x of the vibration damping subject. On the other hand, propagation of floor vibration u can be canceled at the input terminal. In this case, a signal E' shown in FIG. 11, i.e., an acceleration $d^2u/dt^2$ of floor vibration, is detected, and is feedforward-processed. In a conventional active vibration isolation device using a piezoelectric element as an actuator, no feedforward arrangement which sets a vibration detection sensor on a setting floor and uses the output from this sensor is available.

Figure 13:
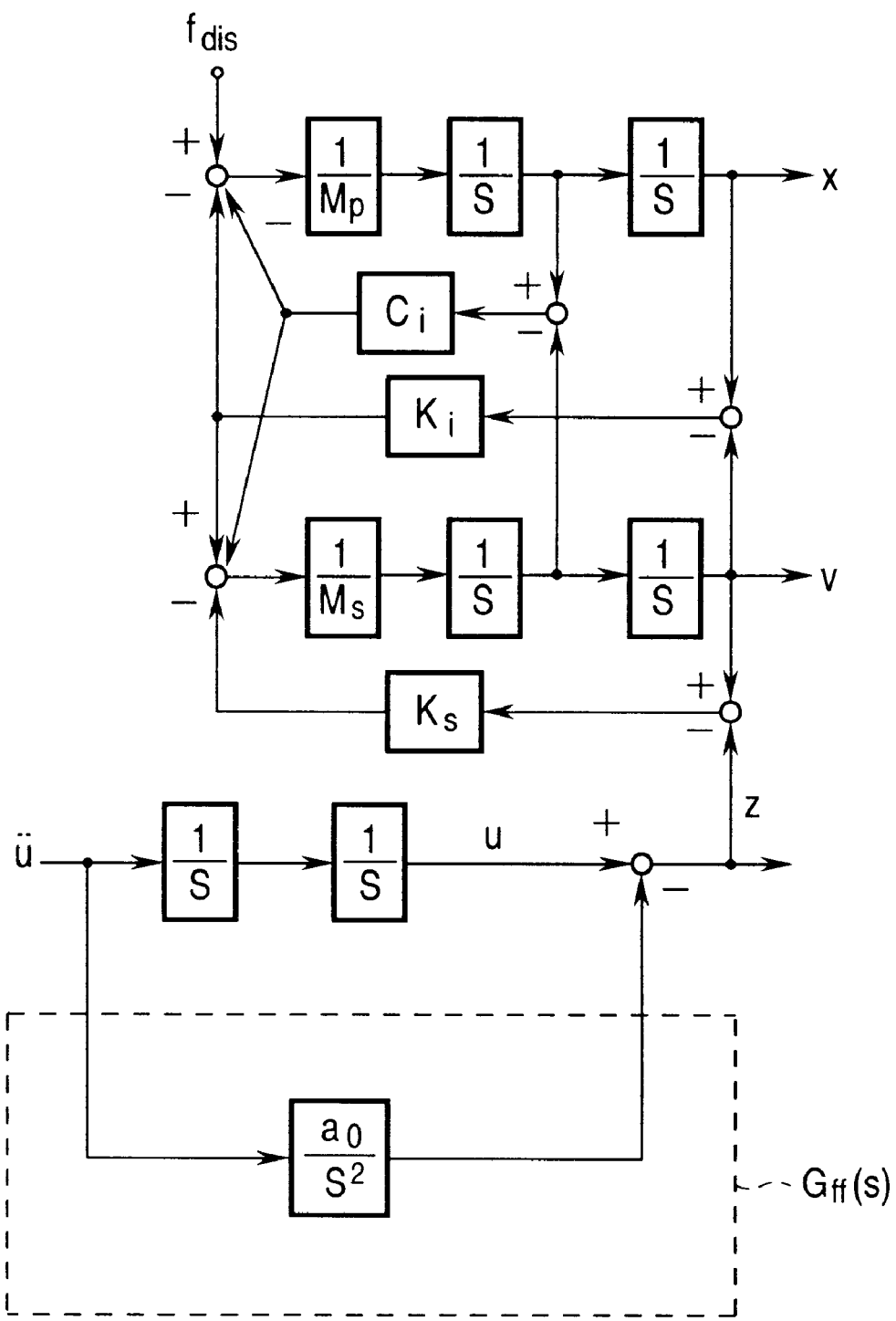
FIG. 13 is a block diagram for explaining the feedforward arrangement using a double integrator.

In order to damp propagation of the vibration displacement u of the floor to the vibration damping subject with the mass $M_p$, as shown in FIG. 13, the acceleration $d^2u/dt^2$ of floor vibration is detected, and displacement of a piezoelectric element is generated via $G_{ff}(s)$. That is, at the input terminal to an anti-vibration system, the influence of floor vibration is canceled. More specifically, entrance of floor vibration can be damped at the input terminal to a mechanical system using a double integrator given by:

$$G_{ff}(s) = \frac{a_0}{s^2} \quad (29)$$

Figure 14:
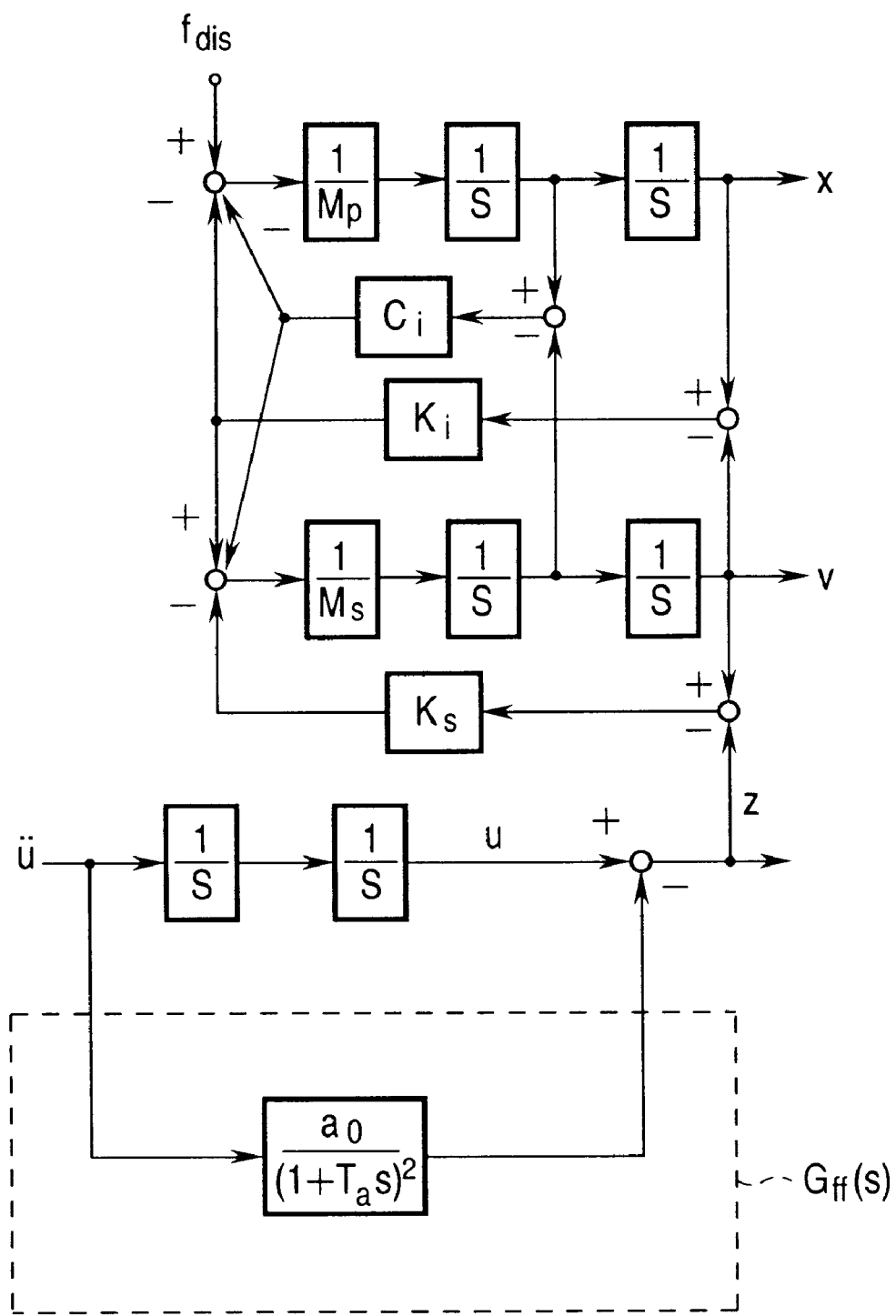
FIG. 14 is a block diagram for explaining the feedforward arrangement using a double pseudo integrator.

In practice, as in an equation below, a transfer function that cascade-connects two first-order delay filters is used (see FIG. 14).

$$G_{ff}(s) = \frac{a_0}{(1 + T_a s)^2} \quad (30)$$

where $a_0$ includes the sensitivity of an acceleration sensor that detects the acceleration of floor vibration, the feedforward gain for that detection output, and the gain of a driver for driving the piezoelectric element.

When the vibration detection means of floor vibration can detect absolute velocity, i.e., when a signal E can be detected in FIG. 11, the orders of equations (29) and (30) fall by one, and they are rewritten as:

$$G_{ff}(s) = \frac{u_0}{s} \quad (31)$$

$$G_{ff}(s) = \frac{a_0}{1 + T_a s} \quad (32)$$

Of course, the feedback processes in the second and third embodiment can be combined with one of feedforward processes given by equations (29) to (32).

<Fifth Embodiment>

In the second and third embodiments, by supporting a vibration damping subject using a plurality of mounts each of which includes a piezoelectric element as a displacement generation actuator, vibration propagation to a semiconductor manufacturing apparatus as the vibration damping subject is damped. More specifically, a plurality of active mounts each assembled with a piezoelectric element are prepared, and are laid out to support the semiconductor manufacturing device to be free from any vibration.

However, it is more desirable to damp not only vibration of the apparatus of interest but also floor vibration of the entire clean room where the semiconductor manufacturing apparatus is set. As is well known, a clean room in LSI manufacturing facilities normally adopts a double floor structure. The space below the floor is used as a return duct and piping space. Hence, the space below the floor can also be used as a setting space of the active vibration isolation device for isolating vibration of the entire floor on which a semiconductor manufacturing apparatus group is set. The floor itself of the clean room where the semiconductor manufacturing apparatus is set can be converted into an active vibration isolation device using most of existing structures without requiring any large-scale reforming.

In this embodiment, the concept of feedback to a displacement generation actuator disclosed in the second to fourth embodiments is used intact, and mechanism members that construct the floor of the clean room are converted into intelligent components by adding piezoelectric elements. With this structure, the mechanism members below the clean room floor transform into an active vibration isolation device. A glimpse of such concept can be taken in studies for practical use of a smart structure that assembles actuators and sensors in structure members. The smart structure has originally been studied and developed for vibration damping of lightweight, elastic space structures.

Figure 15:
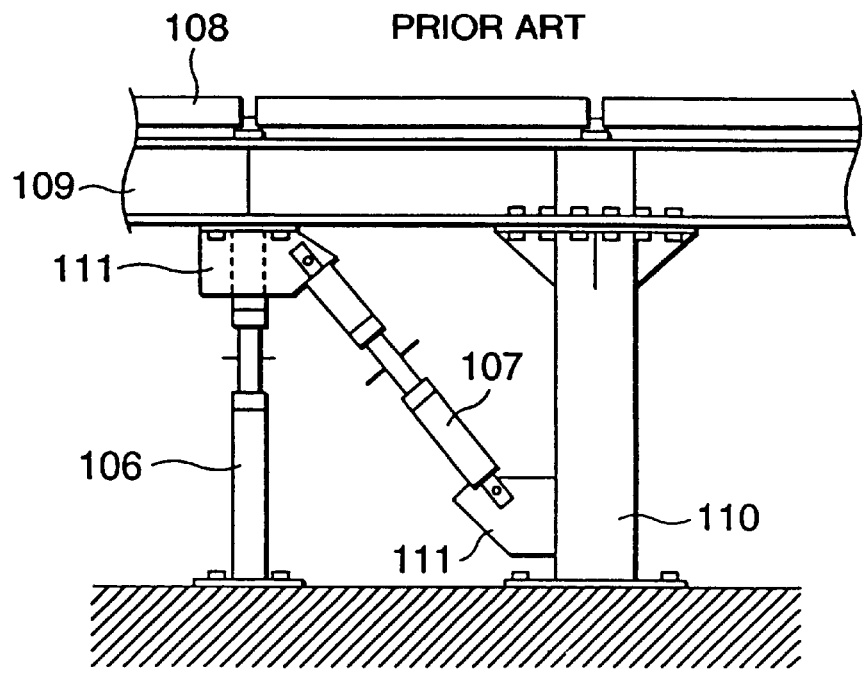
FIG. 15 is a view showing a general underfloor structure of a free access floor.

The conventional double floor structure is as shown in FIG. 15. Using a detachable jack type post 106 and brace 107, the vibration environment of a free access floor on which a grating 108 is laid in is controlled and the underfloor space is broadened to flexibly cope with a change in layout. The post 106 and brace 107 are fixed by bolts using attachment metal members 111 which are rigidly coupled to a beam 109 and stationary column 110, and pre-stresses such as tension and compression are alternately applied to restrict small vibration.

Figure 16:
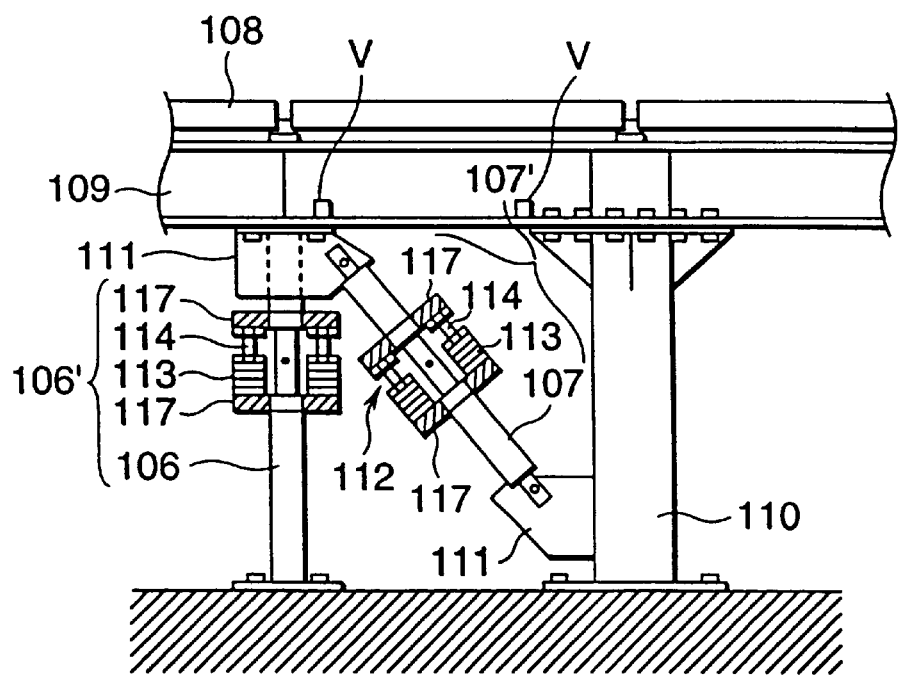
FIG. 16 is a view showing an underfloor structure of a free access floor according to the fifth embodiment of the present invention, in which a post and brace are activated.

In the present invention, an active function is newly added to the post and brace while preserving their original functions. The structure of the present invention will be described in detail below with reference to FIG. 16. Referring to FIG. 16, smart units 112 are respectively newly attached to the post 106 and brace 107. Note that the smart unit 112 is constructed by a piezoelectric element 113, a bolt 114 for applying a compression force to the element 113, and a frame 117 to be rigidly coupled to the post 106 or brace 107. The smart unit 112 can generate a force in a direction parallel to the post 106 or brace 107. Also, a pair of smart units 112 are attached to the post 106 or brace 107. The post and brace to which the smart units 112 are attached will be referred to as an active post 106' and active brace 107' hereinafter.

The piezoelectric element generates a small displacement but a large thrust force. For this reason, by driving the piezoelectric elements in the plurality of smart units 112 which are set to sandwich the post 106 or brace 107, vibrations and deformations in the expansion/contraction directions and bending direction of the post 106 or brace 107 can be reduced. When the beam 109 is supported by the active post 106' and active brace 107' with such function, the vibration level of the entire floor of the clean room can be lowered.

Note that the active post 106' and active brace 107' are controlled as follows.

(1) The active post 106' and active brace 107' are controlled based on outputs from vibration detection means V distributed at a plurality of positions on the beam 109 in FIG. 16.

(2) Or the active post 106' and active brace 107' are controlled on the basis of outputs from vibration detection means originally built in a semiconductor manufacturing apparatus set on the grating 108 or those specially equipped in the semiconductor manufacturing apparatus to control them.

For example, in case of (1), a rigid body motion mode signal and elastic motion mode signal of the beam may be detected and output on the basis of signals from the plurality of vibration detection means provided to the beam, and the active post 106' and active brace 107' may be controlled to reduce rigid body motion mode and elastic motion mode of the beam. Furthermore, a plurality of vibration detection means may be provided to the post or brace on the floor side or on the floor, and the active post 106' and active brace 107' may be controlled to remove floor vibration. Also in the case of (2), such control can be made.

Note that the present invention has been explained in detail using a piezoelectric element that represents a displacement generation actuator. However, a displacement generation actuator active vibration isolation device of the present invention is not limited to the use of the piezoelectric element, but may use a magnetostrictive element or supermagnetostrictive element as a displacement generation actuator.

The effects of the present invention are as follows.

(1) Since a piezoelectric element as a displacement generation actuator with high controllability is used in vibration isolation and vibration damping, a skyhook spring can be easily implemented. The skyhook spring is a spring that acts on a vibration damping subject from an stationary point in a space. The transmissibility in the low-frequency range can be reduced below 0 [dB], and the amplitude of a response to disturbance can be reduced.

(2) Feedback of the present invention is a highly versatile process that covers feedback disclosed by the prior art. Since feedback of the present invention is given by equation (10) or (15) although the conventional feedback is given by equation (3), the number of parameters that must be adjusted increases, and tedious control is required. However, the output signals from the mounted vibration detection means can be fully used, and the transmissibility can be further lowered, as indicated by, e.g., equation (13).

(3) Since vibration of the floor on which the semiconductor manufacturing apparatus is set can be reduced by equipping the displacement generation actuator active vibration isolation device of the present invention, ICs can be printed with high precision, and the yield can be improved, thus greatly contributing to high productivity.

(4) The space below the floor of the clean room with the double floor structure is considered as an area for setting an active vibration isolation device, and an existing post and brace are converted into active components. Hence, floor vibration of the entire clean room where a semiconductor manufacturing apparatus group is set can be reduced.

(5) The active posts and active braces are distributed below the floor of the clean room. Hence, even when floor vibration varies in units of setting areas of semiconductor manufacturing apparatuses, such situation can be flexibly coped with.

As many apparently widely different embodiments of the present invention can be made without departing from the spirit and scope thereof, it is to be understood that the invention is not limited to the specific embodiments thereof except as defined in the appended claims.

What is claimed is:

1. An active vibration isolation device comprising:

an intermediate plate inserted between a vibration damping subject and a setting surface on which the vibration damping subject is set;

an elastic body and a force generation actuator parallelly interposed between the vibration damping subject and said intermediate plate;

a displacement generation actuator interposed between said intermediate plate and the setting surface;

first, second, and third vibration detection means for respectively detecting vibrations of the vibration damping subject, said intermediate plate, and the setting surface; and feedback control means for controlling said force generation actuator on the basis of detection signals from said first and third vibration detection means, and controlling said displacement generation actuator on the basis of a detection signal from said second vibration detection means.

2. The device according to claim 1, wherein said feedback control means adds signals obtained by performing predetermined compensation processes for the detection signals from said first and third detection means, drives said force generation actuator on the basis of the obtained sum signal, and drives said displacement generation actuator by a signal obtained by performing a predetermined compensation process for the detection signal from said second vibration detection means.

3. The device according to claim 2, wherein said first, second, and third vibration detection means comprise absolute velocity sensors, and said feedback control means comprises PID compensators for independently performing compensation processes of outputs from said absolute velocity sensors.

4. The device according to claim 3, wherein an integral gain of the PID compensator for compensating an absolute velocity of said intermediate plate, and an integral gain of the PID compensator for compensating an absolute velocity of the setting surface are set on the basis of a mechanical spring constant of said elastic body so as to set zero transmissibility in a DC range.

5. The device according to claim 3, wherein an integral gain of the PID compensator for compensating an absolute velocity of vibration of the setting surface is set to make an electrical spring constant produced by the integral gain equal to a spring constant of said displacement generation actuator, and a proportional gain of the PID compensator that compensates an absolute velocity of said intermediate plate is set to make an electrical viscous damping coefficient produced by the proportional gain equal to a viscous damping coefficient between the vibration damping subject and said intermediate plate.

* * * * *

UNITED STATES PATENT AND TRADEMARK OFFICE
CERTIFICATE OF CORRECTION

PATENT NO. : 6,378,672 B1
DATED : April 30, 2002
INVENTOR(S) : Shinji Wakui

It is certified that error appears in the above-identified patent and that said Letters Patent is hereby corrected as shown below:

Column 1,
Line 12, "like" should read -- the like --.

Column 2,
Line 22, "dynamics" should read -- dynamic --.

Column 3,
Line 8, "is" should read -- is, --.

Column 4,
Line 46, "cannot be obtained" should be deleted.

Column 6,
Line 29, "the," should read -- the --.

Column 10,
Line 21, "$a_2=)M_s+K_sC_{vs})(K_i+C_{ip})+K_sC_{xs}(C_i+C_{xp})+(K_s+K_sC_{is})(M_p+C_{vp})+K|M_p$" should read -- $a_2=(M_s+K_sC_{vs})(K_i+C_{ip})+K_sC_{xs}(C_i+C_{xp})+(K_s+K_sC_{is})(M_p+C_{vp})+K_iM_p$........(17c) --.

Column 18,
Line 16, "an" should read -- a --.

Signed and Sealed this

Twenty-ninth Day of October, 2002

Attest:

JAMES E. ROGAN
Attesting Officer      Director of the United States Patent and Trademark Office